United States Patent
Lim et al.

(10) Patent No.: US 10,790,239 B2
(45) Date of Patent: Sep. 29, 2020

(54) SEMICONDUCTOR PACKAGE AND BOARD FOR MOUNTING THE SAME

(71) Applicant: SAMSUNG ELECTRONICS CO., LTD., Suwon-si (KR)

(72) Inventors: Jae Hyun Lim, Suwon-Si (KR); Chul Kyu Kim, Suwon-Si (KR); Kyung Moon Jung, Suwon-Si (KR); Han Kim, Suwon-Si (KR); Yoon Seok Seo, Suwon-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/207,053

(22) Filed: Nov. 30, 2018

(65) Prior Publication Data
US 2020/0083176 A1  Mar. 12, 2020

(30) Foreign Application Priority Data
Sep. 12, 2018 (KR) .................. 10-2018-0109023

(51) Int. Cl.
*H01L 23/552* (2006.01)
*H01L 23/31* (2006.01)
(Continued)

(52) U.S. Cl.
CPC ........ *H01L 23/552* (2013.01); *H01L 21/4853* (2013.01); *H01L 21/4857* (2013.01);
(Continued)

(58) Field of Classification Search
CPC .............. H01L 23/552; H01L 23/3128; H01L 23/3675; H01L 23/5383; H01L 23/5386;
(Continued)

(56) References Cited

U.S. PATENT DOCUMENTS 9,337,137 B1    5/2016  Mills
2005/0104222 A1 5/2005  Jeong et al.
(Continued)

FOREIGN PATENT DOCUMENTS

CN    106910732 A    6/2017
JP    11163480 A     6/1999
(Continued)

OTHER PUBLICATIONS

Communication dated Jul. 5, 2019, issued by the Taiwanese Patent Office in counterpart Taiwanese Application No. 107143787.
(Continued)

*Primary Examiner* — Seahvosh Nikmanesh
(74) *Attorney, Agent, or Firm* — Sughrue Mion, PLLC

(57) ABSTRACT

A semiconductor package includes a semiconductor chip having an active surface on which connection pads are disposed and an inactive surface opposing the active surface, an encapsulant disposed to cover at least a portion of the semiconductor chip, and a connection member including a redistribution layer. The redistribution layer includes a plurality of first pads, a plurality of second pads surrounding the plurality of first pads, and a plurality of third pads surrounding the plurality of second pads. Each of the plurality of second pads and each of the plurality of third pads have shapes different from a shape of each of the plurality of first pads. Gaps between the plurality of second pads and gaps between the plurality of third pads are staggered with each other.

28 Claims, 25 Drawing Sheets

(51) Int. Cl.
  *H01L 23/367* (2006.01)
  *H01L 23/538* (2006.01)
  *H01L 23/00* (2006.01)
  *H01L 21/48* (2006.01)
  *H01L 21/56* (2006.01)

(52) U.S. Cl.
  CPC ........ *H01L 21/565* (2013.01); *H01L 23/3128* (2013.01); *H01L 23/3675* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 2224/214* (2013.01); *H01L 2924/3025* (2013.01)

(58) Field of Classification Search
  CPC ............. H01L 23/5389; H01L 21/4853; H01L 21/4857; H01L 21/565
  See application file for complete search history.

(56) References Cited

U.S. PATENT DOCUMENTS

| | | | | |
|---|---|---|---|---|
| 2010/0110656 | A1* | 5/2010 | Ko | H01L 24/97 361/818 |
| 2010/0300738 | A1 | 12/2010 | Ito et al. | |
| 2017/0047293 | A1 | 2/2017 | Moon et al. | |
| 2017/0178992 | A1 | 6/2017 | Jeong et al. | |
| 2017/0330840 | A1 | 11/2017 | Lin et al. | |
| 2018/0053036 | A1 | 2/2018 | Baek et al. | |
| 2018/0053732 | A1 | 2/2018 | Baek et al. | |
| 2018/0138029 | A1 | 5/2018 | Kim et al. | |
| 2018/0145033 | A1 | 5/2018 | Yi et al. | |
| 2018/0174994 | A1 | 6/2018 | Choi et al. | |
| 2018/0182691 | A1 | 6/2018 | Cho et al. | |
| 2019/0109095 | A1 | 4/2019 | Min et al. | |

FOREIGN PATENT DOCUMENTS

| | | |
|---|---|---|
| JP | 2009-231480 A | 10/2009 |
| JP | 2011003584 A | 1/2011 |
| KR | 10-0576156 B1 | 5/2006 |
| KR | 10-2017-0019023 A | 2/2017 |
| KR | 1020170141606 A | 12/2017 |
| KR | 1020180020849 A | 2/2018 |
| KR | 1020180021629 A | 3/2018 |
| KR | 10-2018-0055570 A | 5/2018 |
| KR | 1020180058095 A | 5/2018 |
| KR | 1020180070279 A | 6/2018 |
| WO | 2010137420 A1 | 12/2010 |

OTHER PUBLICATIONS

Communication dated Nov. 21, 2019, issued by the Korean Intellectual Property Office in counterpart Korean Application No. 10-2018-0109023.

Communication dated Mar. 3, 2020 from the Japanese Patent Office in application No. 2018-228902.

* cited by examiner

SEMICONDUCTOR PACKAGE AND BOARD FOR MOUNTING THE SAME

CROSS-REFERENCE TO RELATED APPLICATION(S)

This application claims benefit of priority to Korean Patent Application No. 10-2018-0109023 filed on Sep. 12, 2018 in the Korean Intellectual Property Office, the disclosure of which is incorporated herein by reference in its entirety.

TECHNICAL FIELD

1. Field

The present disclosure relates to a semiconductor package and a board for mounting the same.

BACKGROUND

2. Description of Related Art

Due to remarkable advances in information technology (IT) fields such as mobile communications, semiconductors, networks, and the like, market demand for a product in which various functions are integrated into a single terminal is rapidly growing in the areas of wireless communications, data communications, games, and the like. Accordingly, surface mounting techniques for mounting a package on a board using solder balls or lands have been widely developed.

Electromagnetic interference (EMI) occurring in a package may be shielded somewhat, according to an internal package design. However, when a package is mounted on a printed circuit board (PCB) through solder balls, lands or the like, a space exists between the PCB and the package on which the solder balls, lands or the like are disposed, and there is a limitation in shielding EMI radiating through the space.

SUMMARY

An aspect of the present disclosure is to provide a semiconductor package having a structure effectively shielding electromagnetic waves radiating through a space between a board and the semiconductor package when the semiconductor package is mounted on the board.

In detail, an aspect of the present disclosure is to design a pad of a redistribution layer in such a manner that a plurality of shielding members, respectively including at least one or more shield-dams having predetermined lengths, are introduced to an outer edge of a mounting surface on which an electrical connection metal bump of a package is disposed.

According to an aspect of the present disclosure, a semiconductor package includes a semiconductor chip having an active surface on which connection pads are disposed and an inactive surface disposed opposing the active surface, an encapsulant covering at least a portion of the semiconductor chip, and a connection member disposed on the encapsulant and the active surface of the semiconductor chip, the connection member including a redistribution layer. The redistribution layer includes a plurality of first pads, a plurality of second pads disposed along a circumference of the connection member to surround the plurality of first pads, and a plurality of third pads disposed along the circumference of the connection member to surround the plurality of second pads. Each of the plurality of second pads and each of the plurality of third pads have shapes different from a shape of each of the plurality of first pads. In an extending direction of the circumference of the connection member, gaps between the plurality of second pads and gaps between the plurality of third pads are staggered with each other.

According to an aspect of the present disclosure, a board for mounting of a package includes a printed circuit board including a plurality of first mounting pads, a plurality of second mounting pads surrounding the plurality of first mounting pads, and a plurality of third mounting pads surrounding the plurality of second mounting pads and a semiconductor package mounted on the printed circuit board. The semiconductor package includes a semiconductor chip having an active surface on which connection pads are disposed and an inactive surface opposing the active surface, an encapsulant covering at least a portion of the semiconductor chip, a connection member disposed on the active surface of the semiconductor chip, the connection member including a redistribution layer, a plurality of electrical connection metal bumps disposed on the connection member and connected to the plurality of first mounting pads, a first shielding member disposed on the connection member to surround the plurality of electrical connection metal bumps along a circumference of the connection member and connected to the plurality of second mounting pads, and a second shielding member disposed on the connection member to surround the first shielding member along the circumference of the connection member and connected to the plurality of third mounting pads. Each of the first and second shielding members has a plurality of shield-dams having a predetermined length along the circumference of the connection structure.

According to an aspect of the present disclosure, a semiconductor package includes: a semiconductor chip having an active surface on which connection pads are disposed and an inactive surface opposing the active surface; an encapsulant covering at least a portion of the semiconductor chip; and a connection member disposed on the encapsulant and the active surface of the semiconductor chip, the connection member including a redistribution layer. The redistribution layer includes a plurality of first pads, a plurality of second pads spaced apart from each other by first gaps and surrounding the plurality of first pads, and a plurality of third pads spaced apart from each by second gaps other and surrounding the plurality of second pads. One of the plurality of second pads is disposed between the plurality of first pads and one of the second gaps.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the attached drawings.

Electronic Device

Figure 1:
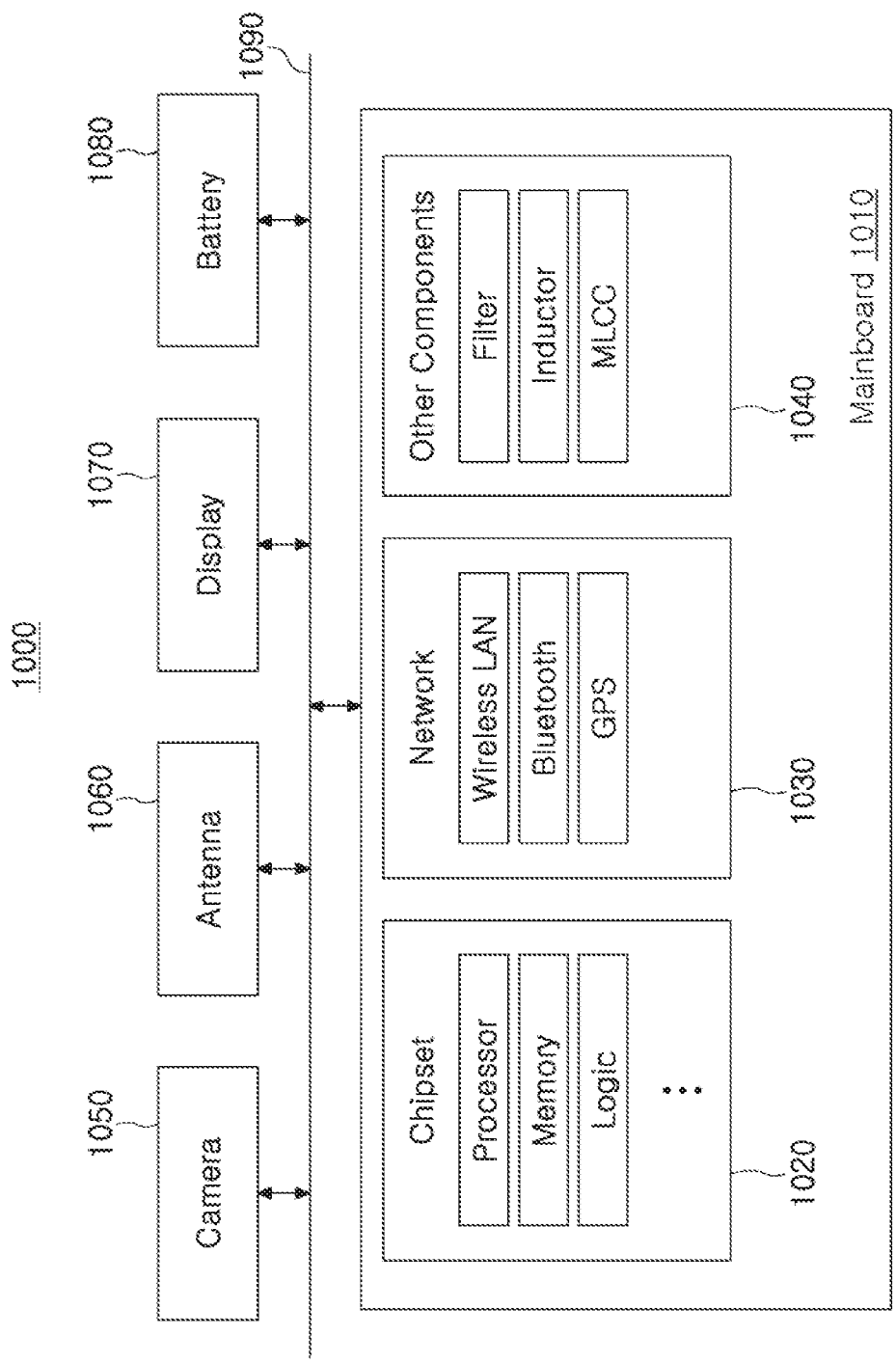
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
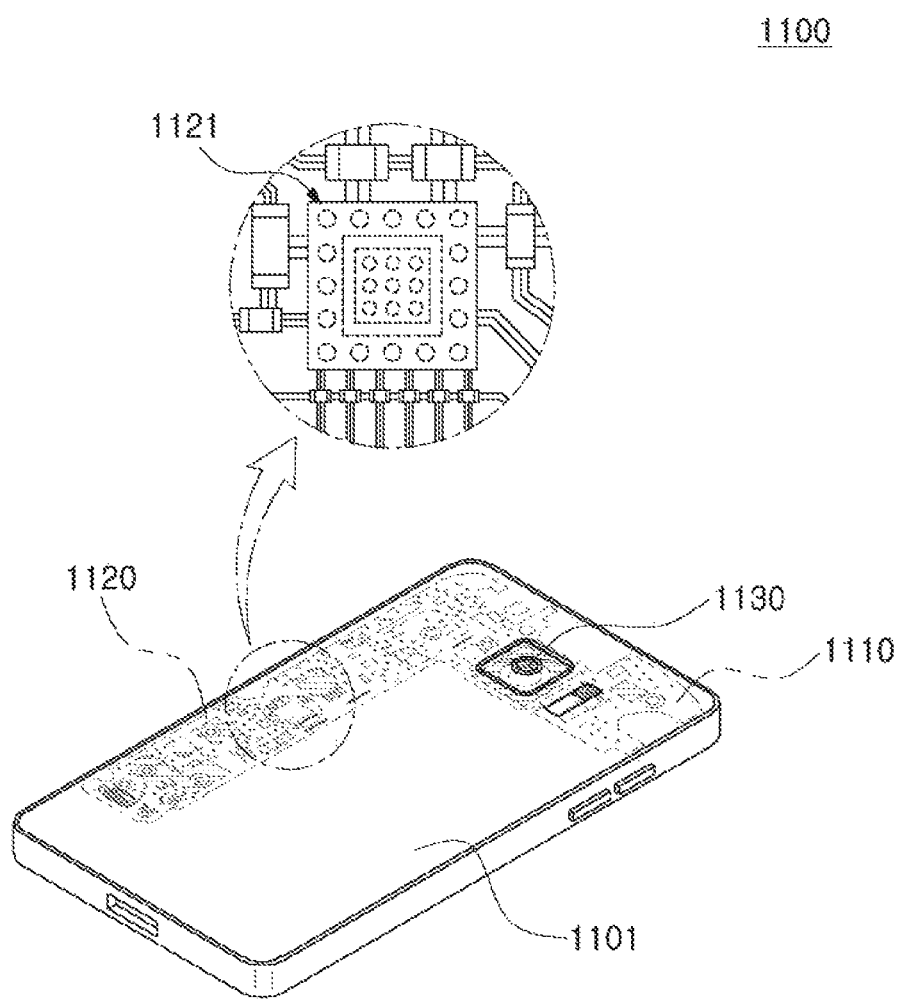
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3A:
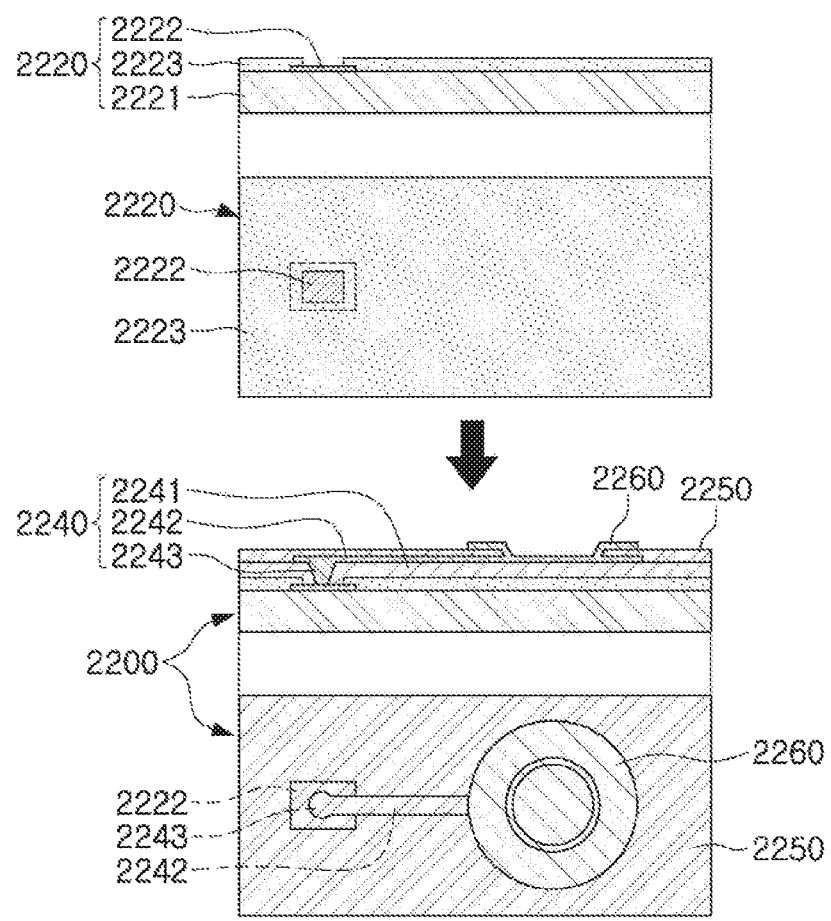
FIGS. 3A and 3B are schematic cross-sectional views illustrating states of a fan-in semiconductor package before and after being packaged.
Figure 3B:
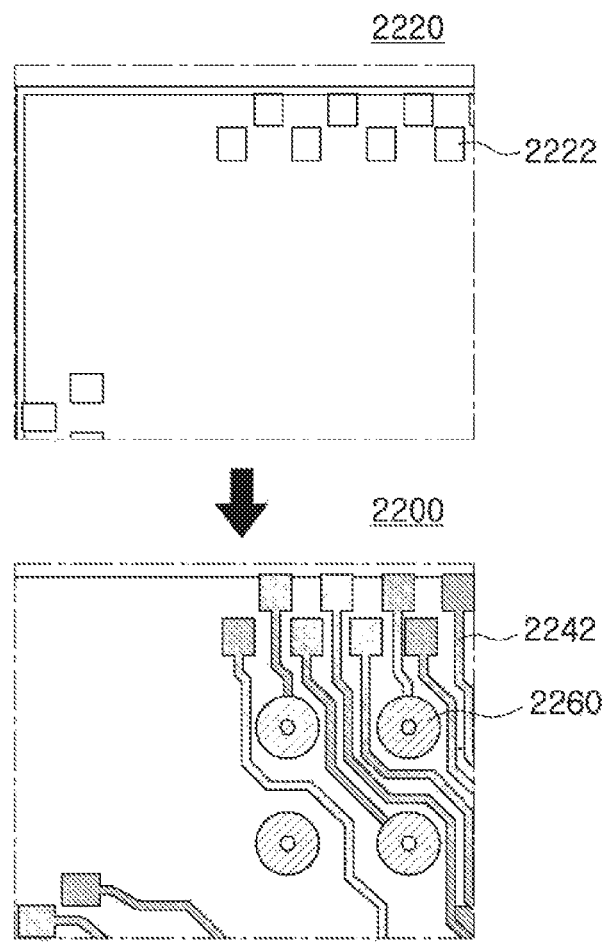

FIGS. 3A and 3B are schematic cross-sectional views illustrating states of a fan-in semiconductor package before and after being packaged.

Figure 4:
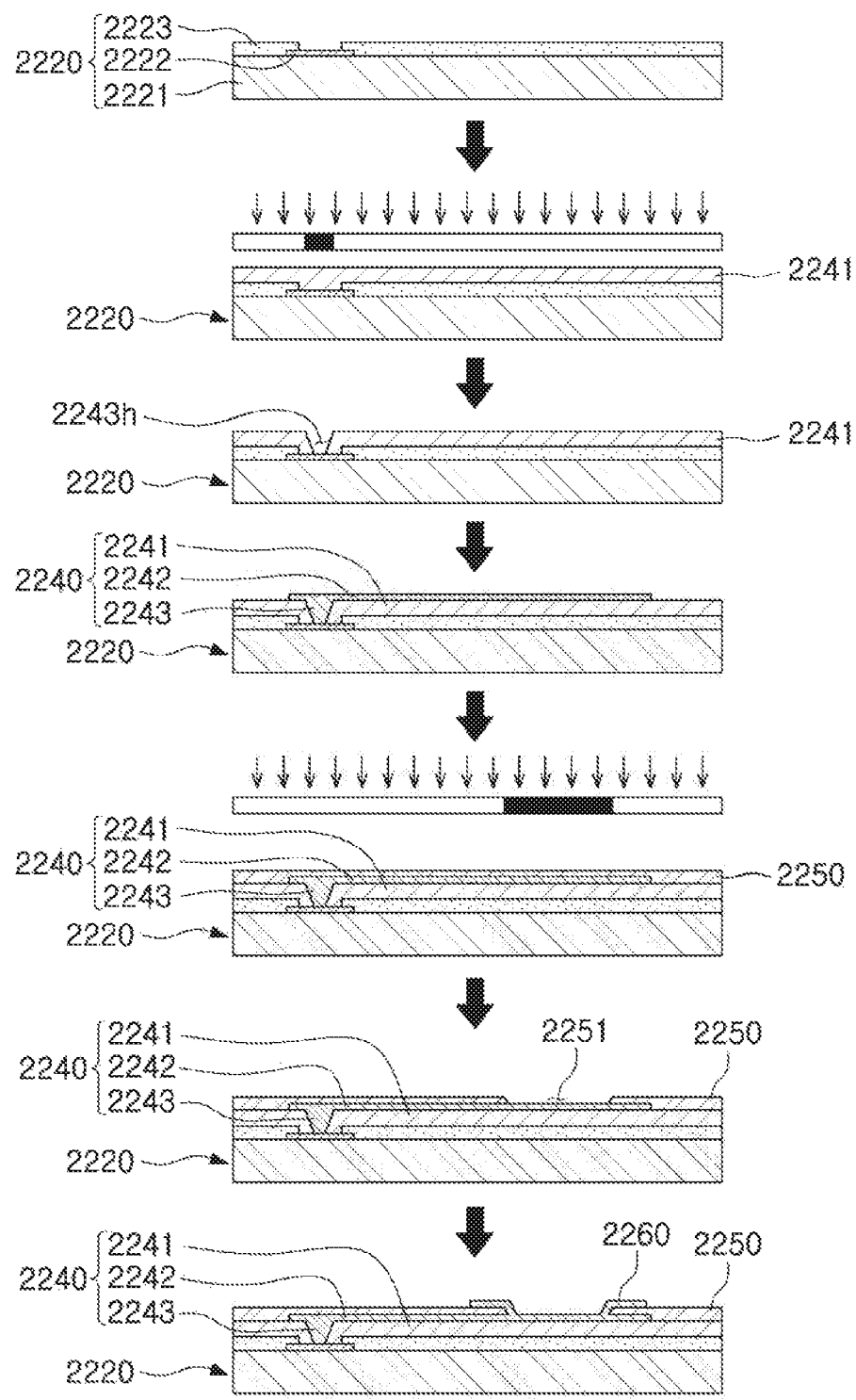
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the mainboard of the electronic device.

Figure 5:
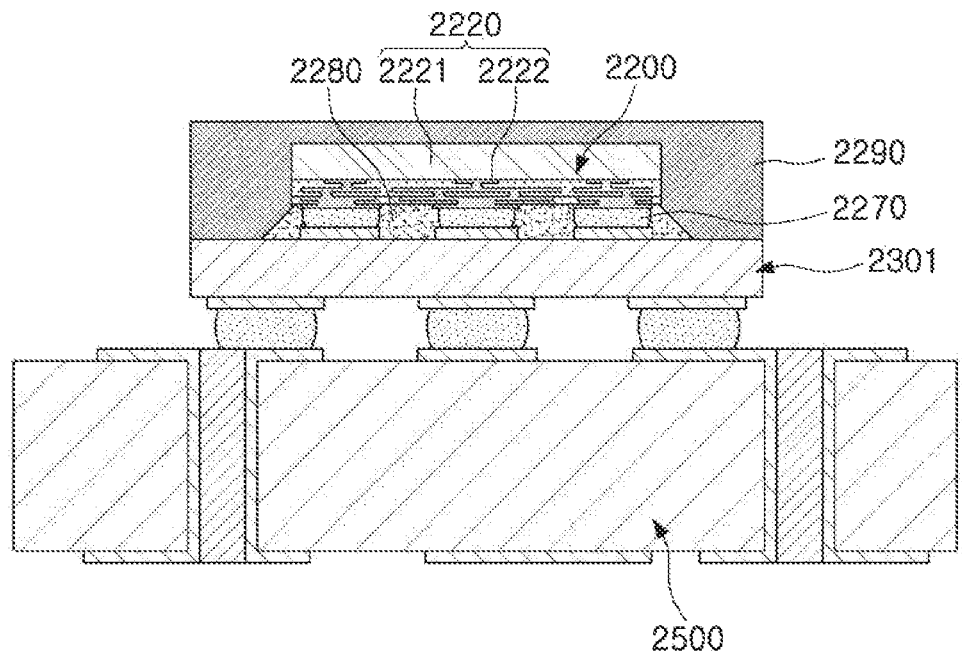
FIG. 5 is a schematic cross-sectional view illustrating a case in which a fan-in semiconductor package is mounted on a ball grid array (BGA) substrate and is ultimately mounted on a mainboard of an electronic device.

FIG. 5 is a schematic cross-sectional view illustrating a case in which a fan-in semiconductor package is mounted on a ball grid array (BGA) substrate and is ultimately mounted on a mainboard of an electronic device.

Figure 6:
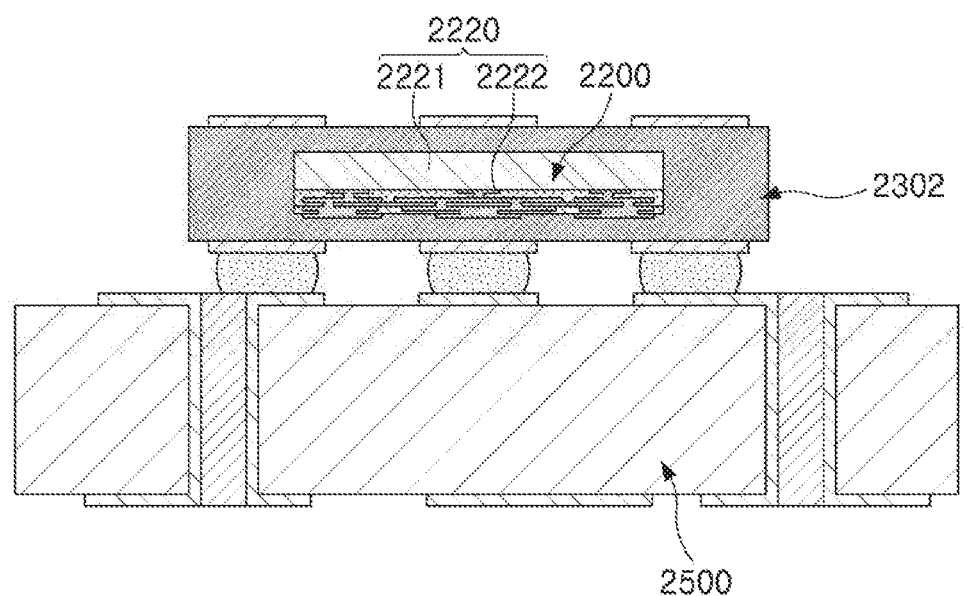
FIG. 6 is a schematic cross-sectional view illustrating a case in which a fan-in semiconductor package is embedded in a BGA substrate and is ultimately mounted on a mainboard of an electronic device.

FIG. 6 is a schematic cross-sectional view illustrating a case in which a fan-in semiconductor package is embedded in a BGA substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a BGA substrate 2301, and the fan-in semiconductor package 2200 may be ultimately mounted on a mainboard 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate BGA substrate 2302, connection pads 2222, that is, I/O terminals, of the semiconductor chip 2220 may be redistributed by the BGA substrate 2302 in a state in which the fan-in semiconductor package 2200 is embedded in the BGA substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate BGA substrate and be then mounted on the mainboard of the electronic device through a packaging process or may be mounted and used on the mainboard of the electronic device in a state in which it is embedded in the BGA substrate.

Fan-Out Semiconductor Package

Figure 7:
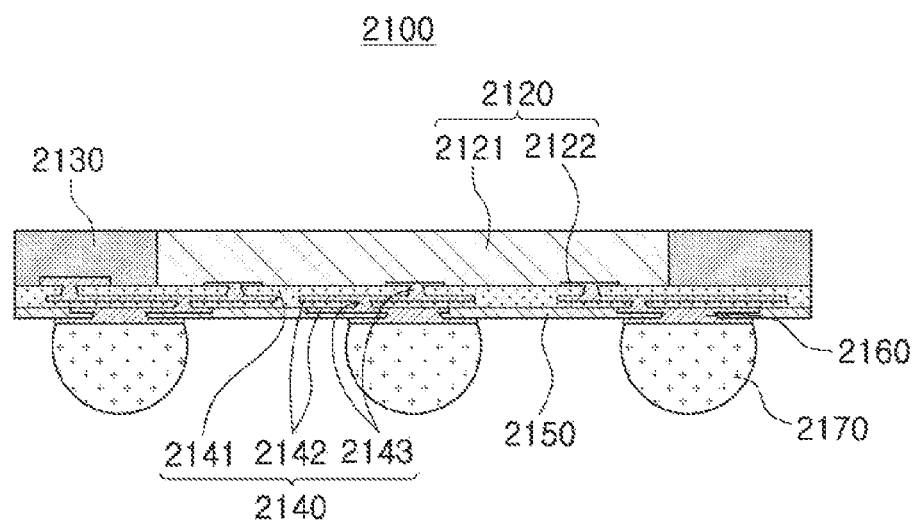
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate BGA substrate, as described below.

Figure 8:
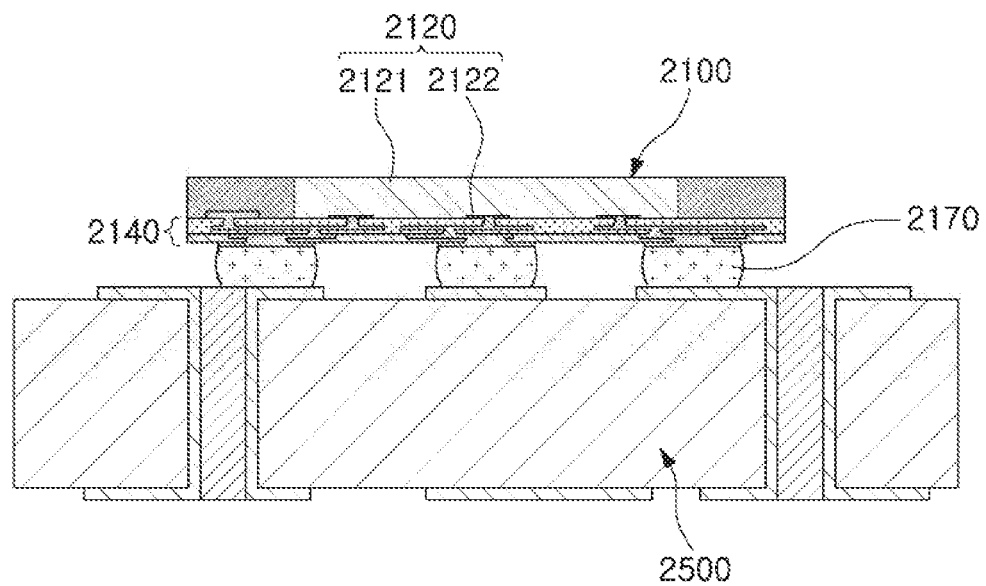
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate BGA substrate, or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a BGA substrate, or the like, having a scale, a purpose, and the like, different from those of the fan-out semiconductor package, and having the fan-in semiconductor package embedded therein.

Figure 9:
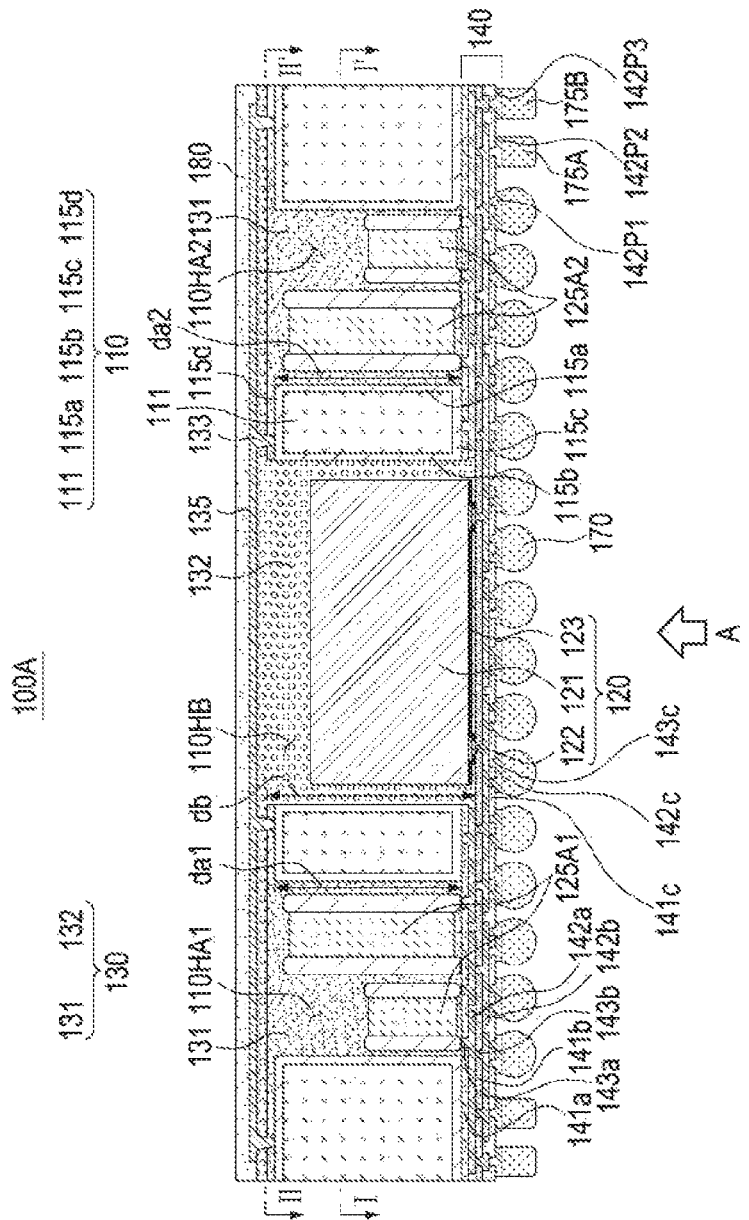
FIG. 9 is a schematic cross-sectional view illustrating an example of a semiconductor package.

FIG. 9 is a schematic cross-sectional view illustrating an example of a semiconductor package.

Figure 10:
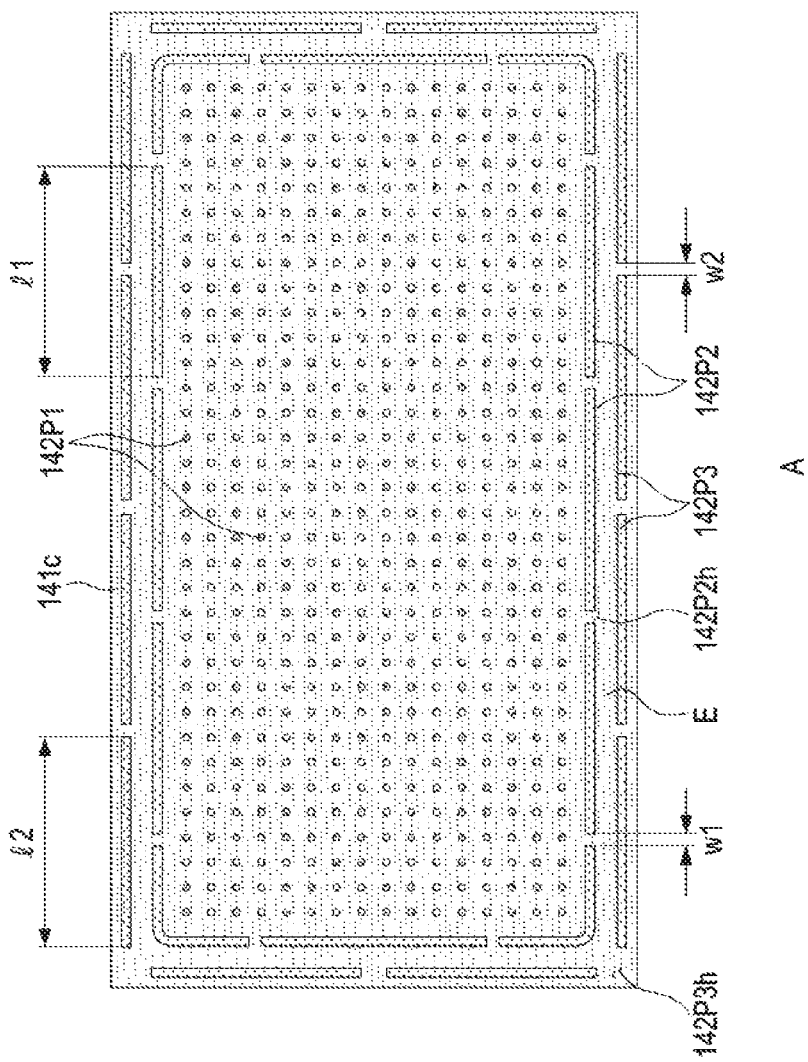
FIG. 10 is a schematic plan view illustrating a design of a pad of a lowermost redistribution layer when the semiconductor package in FIG. 9 is viewed in a direction 'A'.

FIG. 10 is a schematic plan view illustrating a design of a pad of a lowermost redistribution layer when the semiconductor package in FIG. 9 is viewed in direction 'A'.

Figure 11:
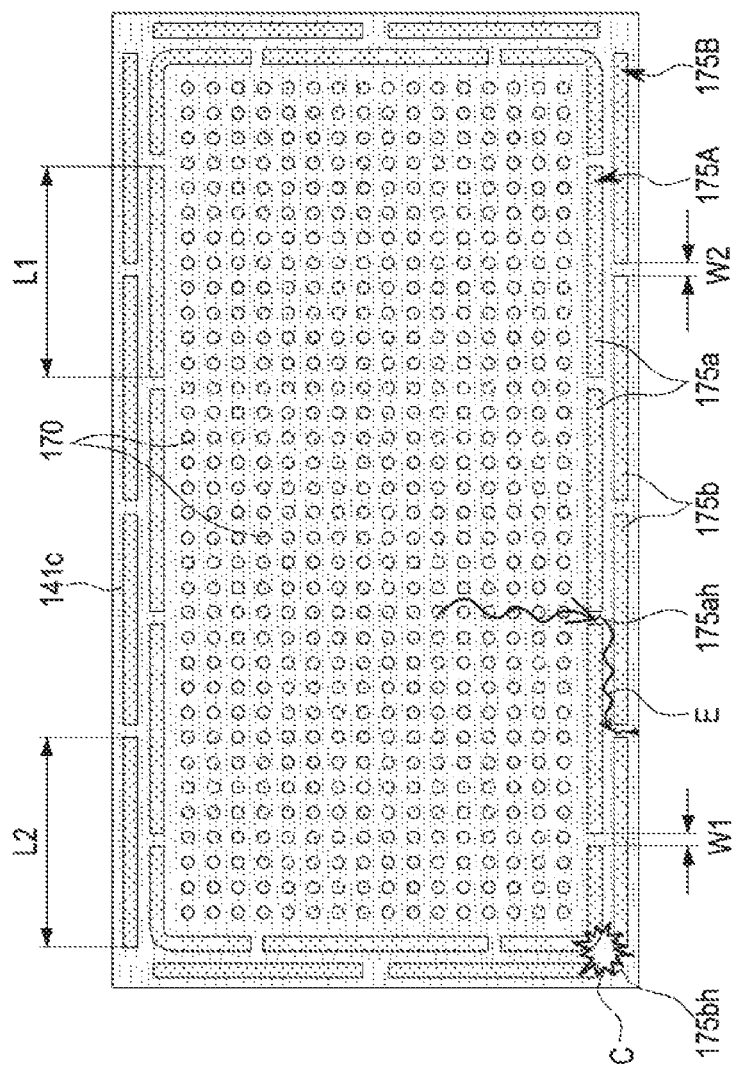
FIG. 11 is a schematic plan view illustrating a design of an electrical connection metal bump and a shielding member when the semiconductor package in FIG. 9 is viewed in direction 'A'.

FIG. 11 is a schematic plan view illustrating a design of an electrical connection metal bump and a shielding member when the semiconductor package in FIG. 9 is viewed in direction 'A'.

Figure 12:
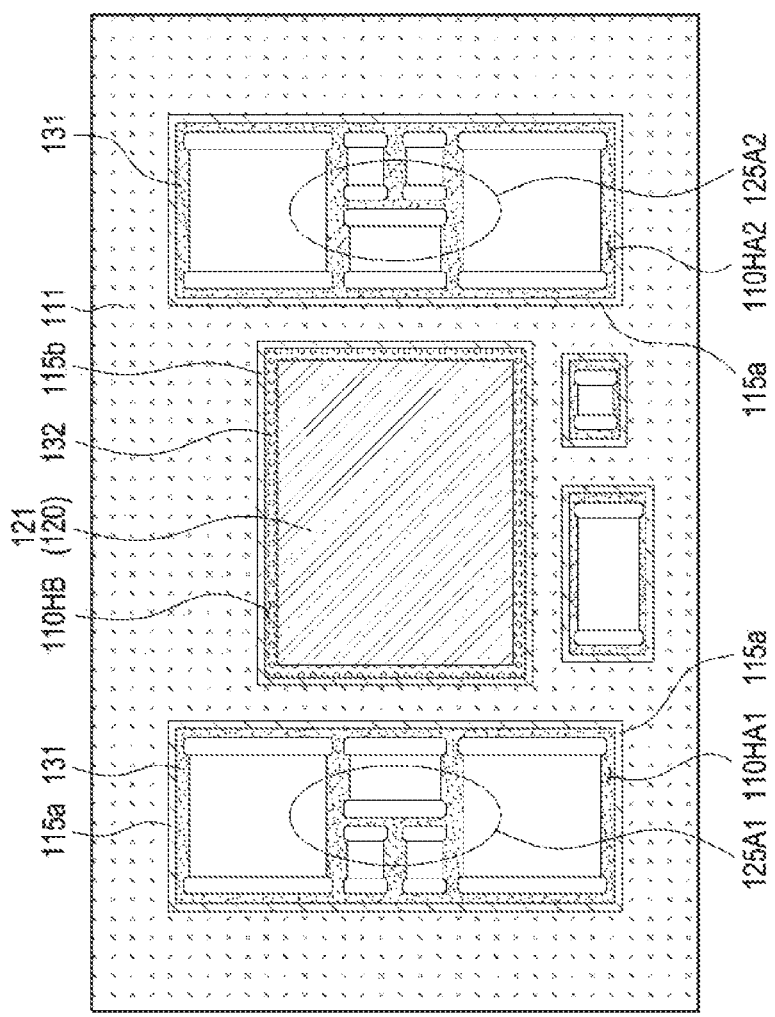
FIG. 12 is a schematic cross-sectional plan view taken along line I-I' in FIG. 9.

FIG. 12 is a schematic cross-sectional plan view taken along line I-I' in FIG. 9.

Figure 13:
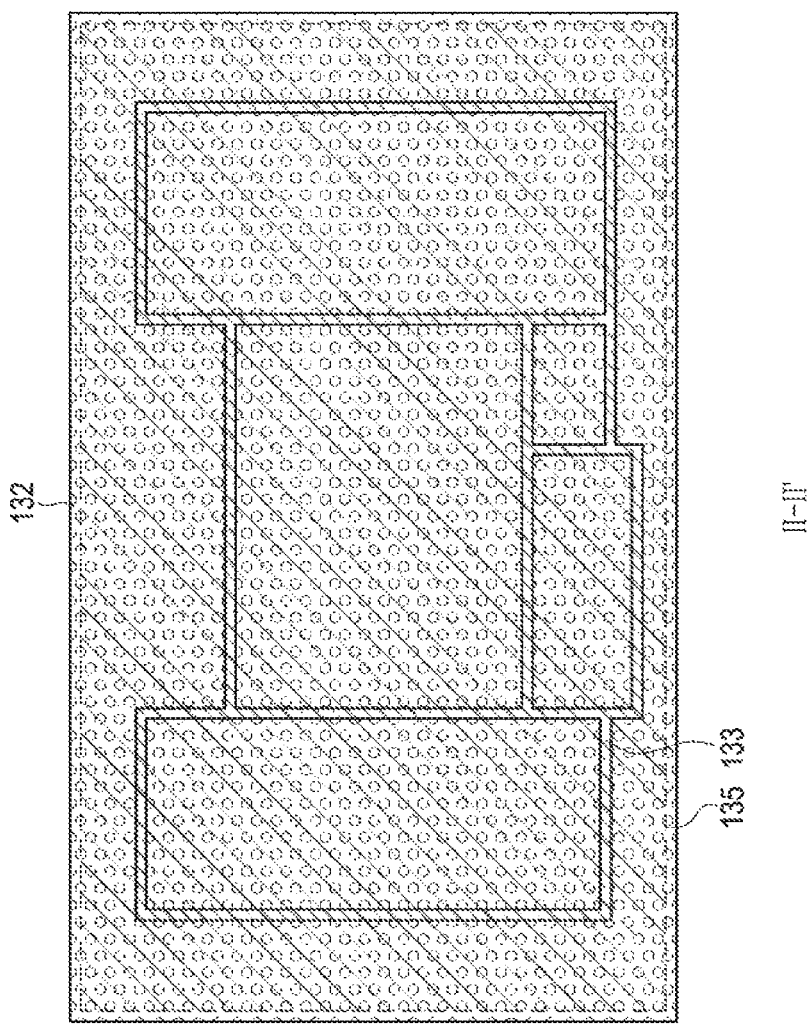
FIG. 13 is a schematic cross-sectional plan view taken along line II-II' in FIG. 9.

FIG. 13 is a schematic cross-sectional plan view taken along line II-II' in FIG. 9.

Referring to FIGS. 9 to 13, a semiconductor package 100A includes a semiconductor chip 120 having an active surface on which a plurality of connection pads 122 are disposed and an inactive surface opposing the active surface, an encapsulant 130 covering at least a portion of the semiconductor chip 120, a connection member 140 disposed on the encapsulant 130 and the active surface of the semiconductor chip 120 and including one or more redistribution layers 142a, 142b, and 142c electrically connected to the plurality of connection pads 122, a plurality of electrical connection metal bumps 170 disposed on the connection member 140 and electrically connected to the plurality of connection pads 122 through the redistribution layers 142a, 142b, and 142c, a first shielding member 175A disposed on the connection member 140 to surround the plurality of electrical connection members 170 along a circumference of the connection member 140, and a second shielding member 175B disposed to surround the first shielding member 175A along the circumference of the connection member 140. The first and second shielding members 175A and 175B may include at least one or more shield-dams 175a and 175b having predetermined lengths L1 and L2 along the circumference of the connection member 140, respectively.

As mentioned above, electromagnetic interference (EMI) occurring in a package may be shielded somewhat according to an internal package design. However, when a package is mounted on a printed circuit board (PCB) through solder balls, lands or the like, a space exists between the PCB and the package on which the solder balls, lands or the like are disposed, and there is a limitation in shielding EMI radiating through the space. In general, an outer edge of a lower side of a package is a portion in which reliability is most vulnerable. Accordingly, when the electrical connection metal bump is simply disposed, board-level reliability may be degraded.

Meanwhile, in the semiconductor package 100A, pads 142P1, 142P2, and 142P3 of a lowermost redistribution layer 142C of the connection member 140 are designed in such a manner that the plurality of shielding members 175A and 175B surrounding the electrical connection metal bump 170 are introduced to an outside of a lower package portion on which the electrical connection metal bump 170 for mounting on a printed circuit board is disposed. In detail, the lowermost redistribution layer 142C of the connection member 140 includes a plurality of first pads 142P1, a plurality of second pads 142P2 disposed to surround the plurality of first pads 142P1 along the circumference of the connection member 140, and a plurality of third pads 142P3 disposed to surround the plurality of second pads 142P2 along the circumference of the connection member 140. Each of the second pads 142P2 and the third pads 142P3 is disposed to have a shape different from a shape of each of the first pads 142P1. For example, each of the second pads 142P2 and each of the third pads 142P3 may have predetermined lengths l1 and l2 along the circumference of the connection member 140, and each of the first pads 142P1 may have a circular shape. Accordingly, the plurality of shielding members 175A and 175B surrounding the electrical connection metal bump 170 on the outside of a lower package portion are introduced to be connected to the plurality of second and third pads 142P2 and 142P3. Even when the semiconductor package 100A is mounted on a printed circuit board 200 (shown in FIG. 20), a space between the semiconductor package 100A and the printed circuit board 200 is blocked at the edge through the plurality of shielding members 175A and 175B to significantly reduce radiating electromagnetic waves E. In addition, the plurality of shielding members 175A and 175B respectively including the shield-dams 175a and 175b having the predetermined lengths L1 and L2 are disposed in such a reliability-vulnerable portion to have an effect that a similar material of a larger area is disposed, compared with a case in which the electrical connection metal bump 170 is simply dispose. Thus, reliability, in further detail, board-level reliability may also be improved.

The first and second shielding members 175A and 175B may discontinuously surround the plurality of electrical connection metal bumps 170 and the first shield shielding member 175A along the circumference of the connection member 140, respectively. For example, the first and second shield members 175A and 175B may have a plurality of shield-dams 175a and 175b and a plurality of gaps 175ah and 175bh formed between the plurality of shield-dams 175a and 175b, respectively. Due to the gaps 175ah and 175bh, for example, existence of spaced points, the shield-dams 175a and 175b may be prevented from being disconnected by a stress. Moreover, various gases produced during processes may be exhausted to further improve reliability. In this case, the gaps 175ah and 175bh of the first and second shielding members 175A and 175B, for example, spaced points may be disposed so as not to intersect. In a direction perpendicular to the circumference of the connection member 140, the gaps 175bh between the shield-dams 175b may overlay within one or more of the shield-dams 175a, and the gaps 175ah between the shield-dams 175a may overlay within one or more of the shield-dams 175b. The gaps 175bh between the shield-dams 175b and the gaps 175ah between the shield-dams 175a may be staggered with each other, in an extending direction of the first and second shield members 175A and 175B along the circumference of the connection member 140. The shield-dams 175b and the shield-dams 175a may be staggered with each other, in the extending direction of the first and second shield members 175A and 175B along the circumference of the connection member 140. Accordingly, the electromagnetic waves E may be effectively shielded while passing through a winding path, as shown in FIG. 11. For example, the electromagnetic waves E may be shielded in spite of the presence of the gaps 175ah and 175bh. To this end, gaps 142P2h and 142P3h between the plurality of second pads 142P2 and between the plurality of third pads 142P3 connected to the first and second shield-damps 175a and 175b of the first and second shielding members 175A and 175B may also be disposed so as not to intersect, respectively. In a direction perpendicular to the circumference of the connection member 140, the gaps 142P3h between the plurality of third pads 142P3 may overlay within one or more of the plurality of second pads 142P2 and the gaps 142P2h between the plurality of second pads 142P2 may overlay within one or more of the plurality of third pads 142P3. The gaps 142P3h between the plurality of third pads 142P3 and the gaps 142P2h between the plurality of second pads 142P2 may be staggered with each other, in an extending direction of the plurality of second pads 142P2 and the plurality of third pads 142P3 along the circumference of the connection member 140. The plurality of second pads 142P2 and the plurality of third pads 142P3 may be staggered with each other, in the extending direction of the plurality of second pads 142P2 and the plurality of third pads 142P3 along the circumference of the connection member 140. The gaps 142P2h and 142P3h between the plurality of second pads 142P2 and between the plurality of third pads 142P3 refer to portions in which materials of the shield-dams 175a and 175b such as solder balls or the like are not connected to each other by a reflow process. For example, a case, in which the second and third pads 142P2 and 142P2 are partially spaced apart from each other by a predetermined distance in such a manner that materials of the shield-dams 175a and 175b such as solder balls or the like disposed on the respective pads 142P2 and 142P3 are connected, is excluded from the meaning of a gap.

The second shielding member 175B may have a gap 175bh formed in at least one corner of the electrical connection metal bump 170, for example, a gap 175bh at a corner of an outer edge of a lower side of the package. In addition, the first shielding member 175A may cover, in a rounded form, a corner of the electrical connection metal bump 175A in which the gap 175bh of the second shielding member 175B is formed, for example, a corner of the outer edge of a lower side of the package 100A without having a gap 175ah at the corner of the lower outer edge of the package 100A. In a lower outermost edge of the package 100A, a corner region is a portion in which reliability is vulnerable. When the shield-dam 175b of the second shielding member 175B or the like is disposed in the corner region, cracking C may easily occur due to stress concentration. Accordingly, in detail, the shield-dam 175b of the second shielding member 175B is not disposed in the corner region. However, when the shield-dam 175a of the first shielding member 175A is not disposed in the corner region, electromagnetic waves easily radiate to the corner region. In detail, the corner region is covered with at least the shield-dam 175a of the first shielding member 175A. In most detail, four corner regions may all have such a disposition, as shown in FIG. 11, but the configuration thereof is not limited thereto. To this end, the plurality of third pads 142P3 may have at least one gap 142P3H formed in at least one corner of the connection member 140, and at least one of the plurality of second pads 142P2 may be disposed at the corner of the connection member 140, in which the gap 142P3*h* of the plurality of third pads 142P3 is formed, to cover the corner in a round form. In most detail, four corner regions may all have such a disposition, as shown in FIG. 10, but the configuration thereof is not limited thereto.

The shield-dams 175*a* and 175*b* of the first and second shielding members 175A and 175B may have predetermined lengths L1 and L2 greater than widths W1 and W2 of the gaps 175*ah* and 175*bh* of the first and second shielding members 175A and 175B, for example, distances between the first shielding members 175A and between the second shielding members 175B, respectively. When the shield-dams 175*a* and 175*b* have the lengths L1 and L2, an electromagnetic shielding effect and reliability improvement effect may be achieved. In this case, the number of the shield-dams 175*a* and 175*b* and the number of the gaps 175*ah* and 175*bh* are not limited. To this end, lengths of the plurality of second and third pads 142P2 and 142P3 may be greater than the width w1 and w2 of the gaps 142P2*h* and 142P3*h*, respectively.

The at least one or more shield-dams 175*a* and 175*b* of the first and second shielding members 175A and 175B may be electrically connected to at least two connection pads 122, respectively. For example, the shield-dams 175*a* and 175*b* may be electrically connected to and second shielding members 175A and 175B in a one-to-many manner. In this case, the shield-dams 175*a* and 175*b* of the first and second shielding members 175A and 175B may be electrically connected to aground (GND) pattern among the redistribution layers 142*a* and 142*b* of the connection member 140. Thus, the at least two connection pads 122 electrically connected to at least one or more shield-dams 175*a* and 175*b* of the first and second shielding members 175A and 175B may be a ground (GND) pattern connection pad 122 electrically connected to the ground (GND) pattern among the redistribution layers 142*a*, 142*b*, and 142*c* of the connection member 140. To this end, each of the plurality of second and third pads 142P2 and 142P3 may be electrically connected to a ground (GND) pattern among the connection pads 122. For example, a single pad may be electrically connected to many connection pads in a one-to-many relationship.

The plurality of electrical connection metal bumps 170 and the first and second shielding members 175A and 175B may be disposed parallel to each other at substantially the same level on the connection member 140. For example, the first and second shielding members 175A and 175B may be disposed at the same level to surround the plurality of electrical connection metal bumps 170. In this case, the plurality of electrical connection metal bumps 170 may be simultaneously formed and may include the same material, for example, a low-melting point metal including tin (Sn) or a tin-containing alloy.

Hereinafter, each configuration included in the semiconductor package 100A according to an exemplary embodiment will be described in further detail.

The frame 110 is an addition configuration which may provide rigidity of the package 100A according to a detail material and may serve to secure thickness uniformity of the first and second encapsulants 131 and 132. A plurality of first through-holes 110HA1 and 110HA2 and a second through-hole 110HB may be formed in the frame 110. The plurality of first through-holes 100HA1 and 110HA2 and the second through-hole 110HB may be physically spaced apart from each other. Passive components 125A1 and 125A2 may be disposed in the plurality of first through-holes 100HA1 and 110HA2, respectively. The semiconductor chip 120 may be disposed in the second through-hole 110HB. The passive components 125A1 and 125A2 and the semiconductor chip 120 may be spaced apart from wall surfaces of the first through-holes 110HA1 and 110HA2 and the second through-hole 110HB by a predetermined distance to be surrounded by sidewalls of the first through-holes 110HA1 and 110HA2, respectively, but modifications thereof are possible, if necessary.

The frame 110 may include a core insulating layer 111. A material of the core insulating layer 110 is not limited. For example, the material of the core insulating layer 110 may be an insulating material. The insulating material may be a thermosetting resin such as an epoxy resin, a thermoplastic resin such as polyimide, or a resin, in which these resins are impregnated with a core material such as a glass fiber (or a glass cloth or a glass fabric) or the like together with an inorganic filler such as silica, for example, prepreg Ajinomoto build-up film (ABF).

The frame 110 may include first and second metal layers 115*a* and 115*b* disposed on the wall surfaces, on which the first and second through-holes 110HA1, 110HA2, and 110HB of the core insulating layer 110 are formed, to surround the passive components 125A1 and 125A2 and the semiconductor chip 120, respectively, and third and fourth metal layers 115*c* and 115*d* disposed on a top surface and a bottom surface of the core insulating layers 111, respectively. Each of the first to fourth metal layers 115*a*, 115*b*, 115*c*, and 115*d* may include a conductive material such as copper (Cu), aluminum (Al), silver (Ag), tin (Sn), gold (Au), nickel (Ni), lead (Pb), titanium (Ti) or alloys thereof, but a material thereof is not limited thereto. Electromagnetic shielding and heat radiation of the semiconductor chip 120 and the passive components 125A1 and 125A2 may be performed through the first to fourth metal layers 115*a*, 115*b*, 115*c*, and 115*d*. The metal layers 115*a*, 115*b*, 115*c*, and 115*d* may be connected to each other, and may be used as grounds. In the case, the metal layers 115*a*, 115*b*, 115*c*, and 115*d* may be electrically connected to grounds of the redistribution layers 142*a*, 142*b*, and 142*c* of the connection member 140.

Each of the passive components 125A and 125A2 may independently be a capacitor, such as a multilayer ceramic capacitor (MLCC), or a low inductance chip capacitor (LICC), an inductor such as a power inductor, a bead or the like. The passive components 125A1 and 125A2 may have thicknesses different from each other. Also the passive components 125A1 and 125A2 may have thicknesses different from a thickness of the semiconductor chip 120. In the semiconductor package 100A according to an exemplary embodiment, the passive components 125A1 and 125A2 are encapsulated through two or more steps to significantly reduce a defect caused by the thickness variation. The number of the passive components 125A1 and 125A2 is not limited, and may be greater or smaller than the number of the passive components shown in the drawings.

The first encapsulant 131 encapsulates the respective passive components 125A1 and 125A2, and fills at least a portion of each of the first through-holes 110HA1 and 110HA2. In an exemplary embodiment, the first encapsulant 131 also encapsulates the frame 110. The first encapsulant 131 includes an insulating material. A material including an inorganic filler and an insulating resin, for example, a thermosetting resin such as an epoxy resin, a thermoplastic resin such as polyimide, a resin in which a reinforcing material such as an inorganic filler is impregnated with the resins, or the like, may be used. In further detail, an ABF, FR-4, a bismaleimide triazine (BT) resin, or the like, may be used. Also, a molding material such as an epoxy molding compound (EMC) may be used. If necessary, a photoimageable material, for example, a photoimageable encapsulant (PIE) may be used. Also if necessary, a material, in which an insulating resin such as a thermosetting resin or a thermoplastic resin is impregnated with a core material such as an inorganic filler and/or a glass fiber (or a glass cloth or glass fabric), may be used. In either case, the first encapsulant 131 is, in detail, nonconductive.

The semiconductor chip 120 is disposed in the second through-hole 110HB. The semiconductor chip 120 may be spaced apart from a wall surface of the second through-hole 110HB by a predetermined distance to be surrounded by the wall surface of the second through-hole 110HB, but modifications thereof are possible, if necessary. The semiconductor chip 120 may be an integrated circuit (IC) in which hundreds to millions of devices are integrated into a single chip. The IC may be a power management IC (PMIC), but is not limited thereto. The IC may be a memory chip such as a volatile memory (for example, DRAM), a nonvolatile memory (for example, ROM), a flash memory or the like, an application processor chip such as a central processor (for example, CPU), a graphics processor (for example, GPU), a digital signal processor, a cryptographic processor, a microprocessor, a logic chip such as an analog-to-digital converter, an application-specific integrated circuit (ASIC), or the like.

The semiconductor chip 120 may be a bare integrated circuit in which a separate bump or a wiring layer is not formed, but is not limited thereto. If necessary, the semiconductor chip 120 may be a package-type integrated circuit. An integrated circuit may be formed, based on an active wafer. In this case, a base material for forming a body 121 of the semiconductor chip 120 may be silicon (Si), germanium (Ge), gallium arsenide (GaAs), or the like. Various circuits may be formed in the body 121. The connection pad 122 may be provided to electrically connect the semiconductor chip 120 to another component and may be formed of a conductive material such as aluminum (Al), but a material thereof is not limited thereto. A passivation layer 123 may be disposed on the body 121 to expose the connection pad 122. The passivation layer 123 may be an oxide layer or a nitride layer. Alternatively, the passivation layer 123 may be an oxide/nitride double layer. An insulating layer (not shown) and the like may be further provided in other necessary positions. The semiconductor chip 120 has an active surface on which the connection pad 122 is disposed and an inactive surface disposed to oppose to the active surface. In the case in which the passivation layer 123 is provided on the active surface of the semiconductor chip 120, a position relationship of the active surface of the semiconductor chip 120 is determined based on a lowermost surface of the passivation layer 123.

The second encapsulant 132 encapsulates the semiconductor chip 120. Also the second encapsulant 132 fills at least a portion of the through-hole 110HB. In an exemplary embodiment, the second encapsulant 132 also encapsulates the frame 110. The second encapsulant 132 includes an insulating material. A material including an inorganic filler and an insulating resin, for example, a thermosetting resin such as an epoxy resin, a thermoplastic resin such as polyimide, a resin in which a reinforcing material such as an inorganic filler is impregnated with the resins, or the like, may be used. In further detail, an ABF, FR-4, a bismaleimide triazine (BT) resin, or the like, may be used. Also a molding material such as an epoxy molding compound (EMC) may be used. If necessary, a photoresist material, for example, a photoimageable encapsulant (PIE) may be used. Also if necessary, a material, in which an insulating resin such as a thermosetting resin or a thermoplastic resin is impregnated with a core material such as an inorganic filler and/or a glass fiber (or a glass cloth or glass fabric), may be used.

Figure 21:
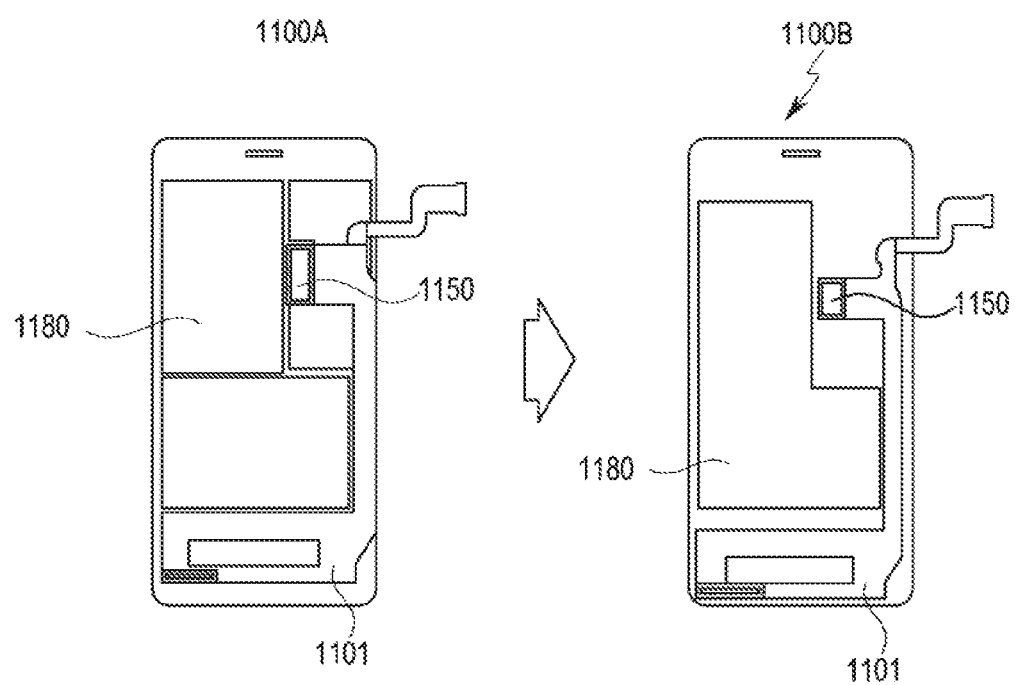
FIG. 21 is a schematic plan view illustrating a significant decrease in a mounting area in a case in which the semiconductor package in FIG. 9 is applied to an electronic device.

As described above, in the semiconductor package 100A, the plurality of passive components 125A1 and 125A2 are disposed in a single package together with the semiconductor chip 120 to be moduled. Thus, a spacing between components may be significantly reduced. As a result, a mounting area of a printed circuit board such as a mainboard 1101 may be significantly reduced, as illustrated in FIG. 21. Moreover, an electrical path between the semiconductor chip 120 and the passive components 125A1 and 125A2 may be significantly reduced to prevent a noise problem. Two or more encapsulation steps 131 and 132, rather than only one encapsulation step, may be performed to significantly reduce a yield problem of the semiconductor chip 120 caused by poor mounting of the passive components 125A1 and 125A2 or an influence of foreign substances produced when the passive components 125A1 and 125A2 are mounted.

If necessary, a backside metal layer 135 may be disposed on the second encapsulant 132 to cover the semiconductor chip 120 and the passive components 125A1 and 125A2. The backside metal layer 135 may be connected to a fourth metal layer 115d of the frame 110 through a backside metal via 133 penetrating the first and second encapsulants 131 and 132. The semiconductor chip 120 and the passive components 125A1 and 125A2 may be surrounded by a metal material through the backside metal layer 135 and the backside metal via 133 to further improve an EMI shielding effect and a heat radiation effect. The backside metal layer 135 and the backside metal via 133 may also include a conductive material such as copper (Cu), aluminum (Al), silver (Ag), tin (Sn), gold (Au), nickel (Ni), lead (Pb), titanium (Ti) or alloys thereof. The backside metal layer 135 and the backside metal via 133 may also be used as a ground. In this case, the backside metal layer 135 may be electrically connected to a ground of the redistribution layers 142a, 142b, and 142c of the connection member 140 through the metal layers 115a, 115b, 115c, and 115d. The backside metal layer 135 may be in the form of a plate covering most of a top surface of the second encapsulant 132, as shown in FIG. 9. The backside metal via 133 may be in the form of a trench via having a predetermined length, as shown in FIG. 12. In this case, all electromagnetic propagation paths may be blocked to exhibit a superior electromagnetic shielding effect. However, a shape of the backside metal layer 135 is not limited thereto, and the backside metal layer 135 may have a plurality of plate shapes within a range having the electromagnetic shielding effect. Openings may be formed in centers of the backside metal vias 133 to provide a gas flow path.

As described above, the semiconductor package 100A may further include the metal layers 115a, 115b, 115c, and 115d disposed on the wall surface and the top and bottom surfaces, on which the first and second through-holes 110HA1, 110HA2, and 110HB of the core insulating layer 110 are formed. Thus, electromagnetic waves which flow into the outside or are emitted from the inside of the semiconductor chip 120 and the passive components 125A1 and 125A2 may be effectively shielded. Furthermore, a heat radiation effect may be achieved. Additionally, the EMI shielding effect and the heat radiation effect of the semiconductor chip 120 and the passive components 125A1 and 125A2 may be further improved through the backside metal via 133 penetrating the backside metal layer 135 disposed on the first encapsulant 131 and/or the second encapsulant 135, the first encapsulant 132, and/or the second encapsulant 132.

The second encapsulant 132 may further include an electromagnetic wave absorbing material, if necessary. For example, the second encapsulant 132 may include a magnetic particle and a binder resin, but is not limited thereto. The magnetic particle may be a metal particle including at least one selected from the group consisting of iron (Fe), chromium (Cr), aluminum (Al), and nickel (Ni) and may be, for example, an Fe—Si—B—Cr-based amorphous metal particle, but is not limited thereto. The magnetic particle may be Ferrite particles such as Mn—Zn ferrite, Ni—Zn ferrite, Ni—Zn—Cu ferrite, Mn—Mg ferrite, Ba ferrite, Li ferrite, or the like. The binder resin may be epoxy, polyimide, a liquid crystal polymer, or mixtures thereof, but is not limited thereto. If necessary, a porous particle may be used as the magnetic particle to achieve electromagnetic absorption characteristics more easily, but is not limited thereto.

As described above, in the semiconductor package 100A according to an exemplary embodiment, the second encapsulant 132 encapsulating the semiconductor chip 120 may have an electrostatic absorption rate higher than an electromagnetic absorption rate of the first encapsulant 131. For example, the second encapsulant 132 may include a magnetic material. In the case in which electromagnetic shielding is simply performed through the metal layers 115a, 115b, 115c, and 115d, the backside metal layer 135, and the backside metal via 133, EMI noise continues to propagate around in the package 100A. Ultimately, the EMI noise may leak out through a portion in which EMI shielding is most vulnerable and may affect devices disposed around the portion in which EMI shielding is move vulnerable. Meanwhile, in the case in which the second encapsulant includes a magnetic material, propagating reflected EMI noise is absorbed by the second encapsulant 132 and leaks out through a ground GND. Thus, a portion vulnerable to EMI may be eliminated. In this case, the first encapsulant 131 encapsulating the passive components 125A1 and 125A2 may be, in detail, a typical insulating material. This is because a short-circuit fault may occur when the first encapsulant 131 is conductive since electrodes are exposed in the case of the passive components 125A1 and 125A2.

The connection member 140 may redistribute the connection pad 122 of the semiconductor chip 120 and may electrically connect the semiconductor chip 120 to the passive components 125A1 and 125A2. Several tens to several hundreds of connection pads 122 of semiconductor chips 120 having various functions may be respectively redistributed through the connection member 140 and may be physically and/or electrically connected to an external device, according to the functions, through the electrical connection metal bump 170 and the shielding members 175A and 175B. The connection member 140 may include a first insulating layer 141a disposed on a lower side of the frame 110 and the passive components 125A1 and 125A2, a first redistribution layer 142a disposed on a bottom surface of the first insulating layer 141a, a first connection via 143a penetrating the first insulating layer 141a to electrically connect the passive components 125A1 and 125A2 to the first redistribution layer 142a, a second insulating layer 141b disposed on the bottom surface of the first insulating layer 141a and the active surface of the semiconductor chip 120 to cover at least a portion of the first redistribution layer 142a, a second redistribution layer 142b disposed on a bottom surface of the second insulating layer 141b, a second connection via 143b penetrating the second insulating layer 141b to electrically connect the first and second redistribution layers 142a and 142b and electrically connect the connection pad 122 of the semiconductor chip 120 and the second redistribution layer 142b, a third insulating layer 141c disposed on the bottom surface of the second insulating layer 141b to cover at least a portion of the second redistribution layer 142b, a third redistribution layer 142c disposed on a bottom surface of the third insulating layer 141c, and a third connection via 143c penetrating the third insulating layer 141c to electrically connect the second and third redistribution layers 142b and 142c. The connection member 140 may include greater numbers of insulating layers, wiring layers, and connection via layers than shown in the drawings.

A material of the first insulating layer 141a may be an insulating material. The insulating material may be a non-photoimageable dielectric including an organic filler such as silica or alumina, for example, ABF. In this case, an undulation problem a problem caused by cracking may be effectively addressed. In addition, an electrode open fault caused by bleeding of a material for forming the first encapsulant 131 may be effectively addressed. For example, when a non-photoimageable dielectric including an inorganic filler is used as a material of the first insulating layer 141a, a problem occurring when a photoimageable dielectric (PID) is simply used may be more effectively addressed.

A photoimageable dielectric (PID) may be used as a material of the second insulating layer 141b. In this case, a fine pitch may be introduced through a photo-via, allowing several tens to several millions of connection pads 122 of the semiconductor chip 120 to be redistributed effectively, similarly to a related-art case. The photoimageable dielectric (PID) may include a small amount of an organic filler or may not include the organic filler. An excellent synergy effect may be achieved by selectively controlling, for example, a material of the first insulating layer 141a on which the first redistribution layer 142a for redistributing the passive components 125A1 and 125A2 and the first connection via 143a are formed and a material of the second insulating layer 141b on which the second redistribution layer 142b for redistributing the connection pad 122 of the semiconductor chip 120 and the second connection via 143b are formed.

If necessary, the first insulating layer 141a formed of a non-photoimageable dielectric including an inorganic filler may have a multilayer structure, the second insulating layer 141b formed of a photoimageable dielectric (PID) may include multiple layers, and both the first and second insulating layers 141a and 141b may include multiple layers. The second through-hole 110HB may penetrate the first insulating layer 141a formed of the non-photoimageable dielectric. In the case in which the first insulating layer 141a includes multiple layers, the second through-hole 110HB may penetrate all the multiple layers.

The first insulating layer 141a may have a coefficient of thermal expansion (CTE) smaller than a CTE of the second insulating layer 141b. This is because the first insulating layer 141a includes an inorganic filler. The second insulating layer 141b may include a small amount of an inorganic filler, if necessary. However, a weight percentage of the inorganic filler included in the first insulating layer 141a may be greater than a weight percentage of the inorganic filler included in the second insulating layer 141b. Accordingly, the CTE of the first insulating layer 141a may also be smaller than the CTE of the second insulating layer 141b. The first insulating layer 141a including a relatively greater amount of an organic filler to have a relatively smaller CTE is advantageous for warpage such as small thermosetting shrinkage. As described above, problems such as undulation or cracking may be effectively addressed, and an electrode open fault of the passive components 125A1 and 125A2 may also be effectively addressed.

The third insulating layer 141c is an insulating layer disposed on a lowermost surface of the package 100A to serve as a passivation layer or a solder resist layer. The third insulating layer 141c includes an insulating resin and an inorganic filler, but may not include a glass fiber. For example, the third insulating layer 141c may be ABF, but is not limited thereto.

The first redistribution layer 142a may redistribute electrodes of the passive components 125A1 and 125A2 to electrically connect the electrodes to the connection pad 122 of the semiconductor chip 120. For example, the first redistribution layer 142a may function as a redistribution layer (RDL). A material for forming the first redistribution layer 142a may be a conductive material such as copper (Cu), aluminum (Al), silver (Ag), tin (Sn), gold (Au), nickel (Ni), lead (Pb), titanium (Ti), alloys thereof, or the like. The first redistribution layer 142a may perform various functions depending on a design. For example, the first redistribution layer 142a may include a ground (GND) pattern, a power (PWR) pattern, a signal (S) pattern, or the like. The signal (S) pattern may include various signal patterns, for example, a data signal pattern, or the like, except for the GND pattern, the PWR pattern, and the like. In addition, the first redistribution layer 142a may include a via pad and the like. The second through-hole 110HB, in which the semiconductor chip 120 is disposed, also penetrates the first insulating layer 141a. The bottom surface of the first redistribution layer 142a may be disposed at substantially the same level as the active surface of the semiconductor chip 120. For example, the bottom surface of the first redistribution layer may be coplanar with the active surface of the semiconductor chip 120.

The second redistribution layer 142b may redistribute the connection pad 122 of the semiconductor chip 120 to electrically connect the connection pad 122 to the electrical connection metal bump 170. For example, the second redistribution layer 142b may function as a redistribution layer (RDL). A material for forming the first redistribution layer 142a may also be a conductive material such as copper (Cu), aluminum (Al), silver (Ag), tin (Sn), gold (Au), nickel (Ni), lead (Pb), titanium (Ti), alloys thereof, or the like. The second redistribution layer 142b may perform various functions depending on a design. For example, the second redistribution layer 142b may include a ground (GND) pattern, a power (PWR) pattern, a signal (S) pattern, or the like. The signal (S) pattern may include various signal patterns, for example, a data signal pattern, or the like, except for the GND pattern, the PWR pattern, and the like. In addition, the second redistribution layer 142b may include a via pad and the like.

The first connection via 143a electrically connects the passive components 125A1 and 125A2 to the first redistribution layer 142a. The first connection via 143a may be in physical contact with the electrode of each of the passive components 125A1 and 125A2. For example, the passive components 125A1 and 125A2 may be in direct contact with the first connection via 143a in an embedded type rather than a surface mounting type using a solder bump or the like. A material for forming the first connection via 143a may be a conductive material such as copper (Cu), aluminum (Al), silver (Ag), tin (Sn), gold (Au), nickel (Ni), lead (Pb), titanium (Ti), alloys thereof, or the like. The first connection via 143a may be completely filled with a conductive material, or a conductive material is provided along a via wall. The first connection via 143a may have a tapered shape.

The second connection via 143b electrically connects the first and second redistribution layers 142a and 142b, disposed on different layers, to each other and also electrically connects the connect pad 122 of the semiconductor chip 120 and the second redistribution layer 142b to each other. The second connection via 143b may be in physical contact with the connection pad 122 of the semiconductor chip 120. For example, the semiconductor chip 120 may be directly connected to the second connection via 143b of the connection member 140 without a separate bump or the like in the form of a bare die. Similarly to the first connection via 143a, a material for forming the second connection via 143b may be a conductive material such as copper (Cu), aluminum (Al), silver (Ag), tin (Sn), gold (Au), nickel (Ni), lead (Pb), titanium (Ti), alloys thereof, or the like. The second connection via 143b may be completely filled with a conductive material, or a conductive material may be provided along a via wall. The second connection via 143b may have a tapered shape.

The second through-hole 110HB may have a depth db greater than depths da1 and da2 of the first through-holes 110HA1 and 110HA2. A bottom surface of the second through-hole 110HB may be disposed to be lower than bottom surfaces of the first through-holes 110HA1 and 110HA2. This is because the second through-hole 110HB may also penetrate the first insulating layer 141a. For example, these bottom surfaces may have a step. The bottom surface of the second through-hole 110HB may be a top surface of the second insulating layer 141b, and bottom surfaces of the first through-holes 110HA1 and 110HA2 may be a top surface of the first insulating layer 141a. For example, the semiconductor chip 120 may have an active surface on which the connection pad 122 connected to the second connection via 143b is disposed and an inactive surface disposed to oppose to the active surface. The active surface of the semiconductor chip 120 may be disposed to be lower than the bottom surfaces of the passive components 125A1 and 125A2. For example, the active surface of the semiconductor chip 120 may be substantially coplanar with the bottom surface of the first wiring layer 143a.

In general, a connection pad of a semiconductor chip is formed of aluminum (Al) and may be easily damaged during laser-via processing. Accordingly, the connection pad is typically opened by photo-via processing rather than laser-via processing. To this end, a photoimageable dielectric (PID) has been used as an insulating layer provided to form a redistribution layer (RDL). However, in the case in which a photoimageable dielectric (PID) is laminated in the same manner to form a redistribution layer (RDL) on a bottom surface of a passive component, undulation may occur due to electrode protrusion of the passive component to deteriorate flatness of the PID. Accordingly, a photoimageable dielectric (PID) having a large thickness should be used to improve the flatness, resulting in inconvenience. In this case, cracking easily occurs due to the thickness of the PID.

Additionally, in the case in which a passive component is encapsulated using an encapsulant, an encapsulant forming material may bleed to an electrode of the passive component. When a photoimageable dielectric (PID) is used to form a redistribution layer (RDL), photo-via processing is performed, as described above. In this case, it may be difficult to open the bleeding encapsulant forming material using the photo-via processing. Accordingly, an electrode open fault may be caused by the bleeding encapsulant forming material. As a result, electrical characteristics may be degraded.

On the other hand, in the semiconductor package 100A according to an exemplary embodiment, after the first through-holes 110HA1 and 110HA2 in which the passive components 125A1 and 125A2 are disposed are formed and the passive components 125A1 and 125A2 are provided, the first insulating layer 141a and the first redistribution layer 142a may be provided to perform first redistribution of the passive components 125A1 and 125A2. After the second through-hole 110HB is formed to penetrate the first insulating layer 141a and the semiconductor chip 120 is provided, the second insulating layer 141b and the second redistribution layer 142b may be provided to perform second redistribution of the semiconductor chip 120. For example, the second through-hole 110HB in which the semiconductor chip 120 is disposed may penetrate not only the frame 110 but also the first insulating layer 141a of the connection member 140. Accordingly, the active surface of the semiconductor chip 120 may be disposed to be lower than bottom surfaces of the passive components 125A1 and 125A2. In this case, a material of the first insulating layer 141a may be selected irrespective of the semiconductor chip 120. For example, the material of the first insulating layer 141a may be a non-photoimageable dielectric, including an inorganic filler rather than a photoimageable dielectric (PID), such as an Ajinomoto build-up film (ABF). Since such a film-type non-photoimageable dielectric has excellent flatness, the above-mentioned undulation and cracking may be more effectively addressed. In addition, since such a non-photoimageable dielectric has an opening formed as a via, the electrode of the passive components 125A1 and 125A2 may be effectively opened through a laser drilling formed via even though a material of the first encapsulant 131 may bleed into the electrodes of the passive components 125A1 and 125A2. Thus, a problem caused by the electrode open fault may also be addressed.

A material of the second insulating layer 141b may be a photoimageable dielectric (PID). In this case, a fine pitch may be introduced through a photo-via. Thus, several tens to several millions of connection pads 122 of the semiconductor chip 120 may be redistributed significantly effectively. For example, the structure of the semiconductor package 100A according to an exemplary embodiment may allow a material of the first insulating layer 141a, where the first redistribution layer 142a for redistributing the passive components 125A1 and 125A2 and the first connection via 143a are formed, and a material of the second insulating layer 141b, where the second redistribution layer 142b for redistributing the connection pad 122 of the semiconductor chip 120 and the second connection via 143b are formed, to be selectively controlled to have an excellent synergy effect.

The third redistribution layer 142c and the third connection via 143c may serve as underbump metals being a lowermost electrical configuration of the package 100A, except for the electrical connection metal bump 170 and the shielding members 175A and 175B. Connection reliability of the electrical connection metal bump 170 and the shielding members 175A and 175B may be improved through the third redistribution layer 142c and the third connection via 143c. The third redistribution layer 142c may mainly serve as a pad of an electrical connection metal bump and a shielding member. For example, the third redistribution layer 142c includes a plurality of first to third pads 142P1, 142P2, and 142P3. A material for forming the third redistribution layer 142c may also be a conductive material such as copper (Cu), aluminum (Al), silver (Ag), tin (Sn), gold (Au), nickel (Ni), lead (Pb), titanium (Ti), alloys thereof, or the like. The third connection via 143c electrically connects the second and third redistribution layers 142b and 142c. Among the third connection vias 143c, a connection via connected to the first pad 142P1 of the third redistribution layer 142c may be connected to the first pad 142P1 in a one-to-many manner. A material for the third connection via 143c may be a conductive material such as copper (Cu), aluminum (Al), silver (Ag), tin (Sn), gold (Au), nickel (Ni), lead (Pb), titanium (Ti), alloys thereof, or the like. The third connection via 143c may also be completely filled with a conductive material, or a conductive material may be provided along a via wall. The third connection via 143c may have a tapered shape.

The third redistribution layer 142c includes a plurality of first pads 142P1, a plurality of second pads 142P2 disposed to surround the plurality of first pads 142P1 along the circumference of the connection member 140, and a plurality of third pads 142P3 disposed to surround the plurality of second pads 142P2 along the circumference of the connection member 140. A shape of each of the plurality of second pads 142P2 and the plurality of third pads 142P3 may be disposed to be different from a shape of each of the plurality of first pads 142P1. For example, each of the plurality of the second pads 142P2 and each of the plurality of third pads 142P3 may have predetermined lengths 11 and 12 along the circumference of the connection member 140, respectively, and each of the plurality of first pads 142P1 may have a circuit shape.

If necessary, the third redistribution layer 142c and the third connection via 143c may be omitted. In this case, the first to third pads 142P1, 142P2, and 142P3 of the connection member 140 connected to the electrical connection metal bump 170 and the shielding members 175A and 175B may be a portion of the second redistribution layer 142b. The electrical connection metal bump 170 and the shielding members 175A and 175B may be directly disposed in an opening formed on the third insulating layer 143c, and a shape of the opening may be changed to conform to the shapes of the electrical connection metal bump 1710 and the shielding members 175A and 175B.

The backside metal layer 135, the backside metal via 133, and the first to fourth metal layers 115a, 115b, 115c, and 115d may be electrically connected to a ground (GND) pattern among the redistribution layers 142a, 142b, and 143c of the connection member 140. Accordingly, when the semiconductor package 100A is mounted on a mainboard or the like of an electronic device, electromagnetic waves may be emitted to a ground or the like of the mainboard through this path.

The electrical connection metal bump 170 may be configured to physically and/or electrically the semiconductor package 100A to an external component. For example, the semiconductor package 100A may be mounted on a mainboard of an electronic device through the electrical connection metal bump 170. The electrical connection metal bump 170 may include a low-melting point metal, for example, tin (Sn) or a tin-containing alloy. More specifically, the electrical connection metal bump 170 may be formed of a solder or the like. However, these cases are only examples and are not limited thereto. The electrical connection metal bump 170 may be a land, a ball, a pin, or the like. The electrical connection metal bump 170 may be a multi-layer structure or a single-layer structure. In a case in which the electrical connection metal bump 170 is formed as a single-layer structure, the electrical connection metal bump 170 may include a tin-silver solder or copper. However, this case is also merely an example and a material thereof is not limited thereto. The number, interval, disposition shape, and the like of the electrical connection metal bumps 170 are not limited and may vary depending on design considerations of a person of ordinary skill in the art. For example, the number of the electrical connection metal bumps 170 may be several tens to several thousands, depending on the number of the connection pads (122), but is not limited thereto.

At least one of the electrical connection metal bumps 170 may be disposed in a fan-out region. The term 'fan-out region' refers to a region except for a region in which the semiconductor chip 120 is disposed. A fan-out package has excellent reliability, allows a plurality of I/O terminals to be implemented, and allows 3D interconnection to be easily achieved, compared with a fan-in package. Moreover, a fan-out package may be fabricated to have a small thickness and has excellent price competitiveness, compared with a ball grid array (BGA), a land grid array (LGA) or the like The shielding members 175A and 175B are configured to shield an electromagnetic waves E radiating through a space between the semiconductor package and a printed circuit board when the semiconductor package 100A is printed on the printed circuit board or the like through the electrical connection metal bump 170. In addition, board-level reliability may be improved through the shielding members 175A and 175B, as described above. The shielding members 175A and 175B include at least one or more shield-dams 175a and 175b having predetermined lengths L1 and L2 along the circumference of the connection member 140, respectively. For example, each of the shielding members 175A and 175B may discontinuously surround the plurality of electrical connection metal bumps 170 and the first shielding member 175A along the circumference of the connection member 140. More specifically, the shielding members 175 and 175B may have a plurality of shielding ms 175a and 175b and a plurality of gaps 175ah and 175bh formed between the plurality of shield-dams 175a and 175b, respectively. Due to the existence of the gaps 175ah and 175bh, for example, spaced points, the shield-dams 175a and 175b may be prevented from being disconnected by stress. In addition, various gases produced during processes may be exhausted to further improve reliability.

The gaps 175ah and 175bh of the shielding members 175A and 175B, for example, the spaced points may be disposed so as not to intersect. Accordingly, the electromagnetic waves E may be effectively shielded while passing through a winding path. For example, the electromagnetic waves E may be shielded in spite of the presence of the gaps 175ah and 175bh. The second shielding member 175B may have at least one corner of the electrical connection metal bump 170, for example, a gap 175bh at a corner of an outer edge of a lower side of the package 110A. In addition, the first shielding member 175A may cover, in a round form, a corner of the electrical connection metal bump 175A in which the gap 175bh of the second shielding member 175B is formed, for example, a corner of the outer edge of a lower side of the package 100A without having a gap 175ah at the corner of the lower outer edge of the package 100A. In this case, the electromagnetic waves E may be effectively shielded and reliability may be further improved, as described above. To this end, gaps 142P2H and 142P3h between the plurality of second pads 142P2 and the plurality of third pads 142P3 connected to the first and second shield-dams 175a and 175b of the first and second shielding members 175A and 175B may also be disposed so as not to intersect, the plurality of third pads 142P3 may have at least one gap 142P3h at the at least one corner of the connection member 140, and at least one of the plurality of second pads 142P2 may be disposed at the corner of the connection member 140 with the gap 142P3h of the plurality of third pads 142P3 to cover the corner in a round form.

The shield-dams 175a and 175b of the shielding members 175A and 175B may be formed of a low-melting point metal, for example, tin (Sn) or a tin-containing alloy. In more detail, the shield-dams 175a and 175b may be formed of a solder or the like, but a material thereof is not limited thereto. The shield-dams 175a and 175b of the shielding members 175A and 175B may have predetermined lengths L1 and L2, greater than widths W1 and W2 of the gaps 175ah and 175bh of the shielding members 175A and 175B, for example, spaces therebetween, respectively. When the shield-dams 175a and 175b of the shielding members 175A and 175B have the lengths L1 and L2, the electromagnetic shielding effect and reliability improving effect may be achieved. The number of the shield-dams 175a and 175b, the number of the gaps 175ah and 175bh, or the like is not limited thereto. To this end, lengths l1 and l2 of each of the plurality of second pads 142P2 and each of the plurality of third pads 142P3 may be greater than widths w1 and w2 of the gaps 142P2h and 142P3h, respectively.

Each of the at least one or more shield-dams 175a and 175b of the shielding members 175A and 175B may be electrically connected to at least two connection pads 122. For example, the shield-dams 175a and 175b may be electrically connected to the connection pads 122 in a one-to-many manner. In this case, the shield-dams 175a and 175b of the shielding members 175A and 175B may be electrically connected to a ground (GND) pattern among the redistribution layers 142a, 142b, and 142c of the connection member 140, and the at least two connection pads 122 electrically connected to each of the at least one or more shield-dams 175a and 175b of the shielding members 175A and 175B ground (GND) connection pads 122 electrically connected to the ground (GND) pattern of the redistribution layers 142a, 142, and 142c of the connection member 140. To this end, each of the plurality of second pads 142P2 and the plurality of third pads 142P3 may be electrically connected to a ground connection pad 122 among the connection pads 122. Each of the plurality of second pads 142P2 and the plurality of third pads 142P3 may be connected to ground (GND) connection pads 122 in a one-to-many manner, for example, a single pad may be electrically connected to a plurality of connection pads.

If necessary, a cover layer 180 may be further disposed on the first encapsulant 131 and/or the second encapsulant 132 to cover the backside metal layer 135. The cover layer 180 may include an insulating resin and an inorganic filler, but may not include a glass fiber. For example, the cover layer 180 may be an ABF, but is not limited thereto.

While the semiconductor package 100A according to an exemplary embodiment has been described as the semiconductor package 100A including the semiconductor chip 120, the semiconductor package 100A may only include the passive components 125A1 and 125A2 except for the semiconductor chip 120. For example, the description of the semiconductor package 100A according to an exemplary embodiment may be understood to extend to an electronic component package 100A. For example, an electronic component package 100A according to an exemplary embodiment may include a plurality of electrical connection metal bumps 170 disposed at its one side, a plurality of first shield-dams 175a spaced apart from each other along a circumference of the one side of the electronic component package 100A to surround the plurality of electrical connection metal bumps 170, and a plurality of second shield-dams 175b spaced apart from each other along the circumference of the one side of the electronic component package 100A to surround the plurality of first shield-dams 175a. The first and second shield-dams 175a and 175b may have predetermined lengths L1 and L2 along the circumference of the one side of the electronic component package 100A, respectively.

Figure 14:
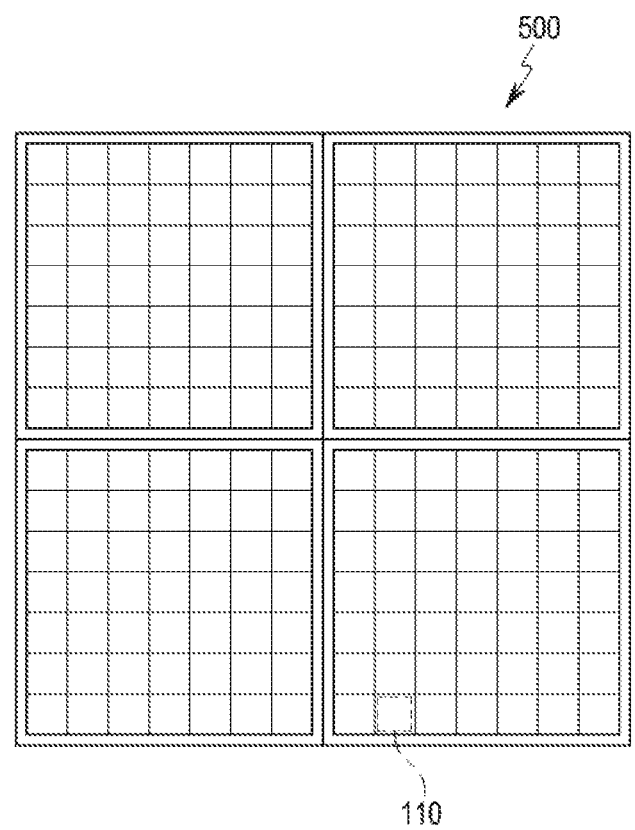
FIG. 14 is a schematic cross-sectional view illustrating an example of a panel used to manufacture the semiconductor package in FIG. 9.

FIG. 14 is a schematic cross-sectional view illustrating an example of a panel used to manufacture the semiconductor package in FIG. 9.

Referring to FIG. 14, a semiconductor package 100A according to an exemplary embodiment may be manufactured using a large-sized panel 500. The panel 500 may have a size two to four times larger than a size of a related-art wafer. Thus, more semiconductor packages 100A may be manufactured through a single process. For example, productivity may be significantly high. In detail, the larger a size of each package 100A, the higher the relative productivity than in a case in which a wafer is used. A unit portion of each panel 500 may be a frame 110 prepared first in a manufacturing method that will be described later. After a plurality of semiconductor packages 100A are simultaneously manufactured using such a panel 500 through a single process, they are cut using a well-known cutting process such as a dicing process or the like to obtain individual semiconductor packages 100A.

FIGS. 15A to 15E are process diagrams illustrating a schematic example of manufacturing the semiconductor package in FIG. 9.

Figure 15A:
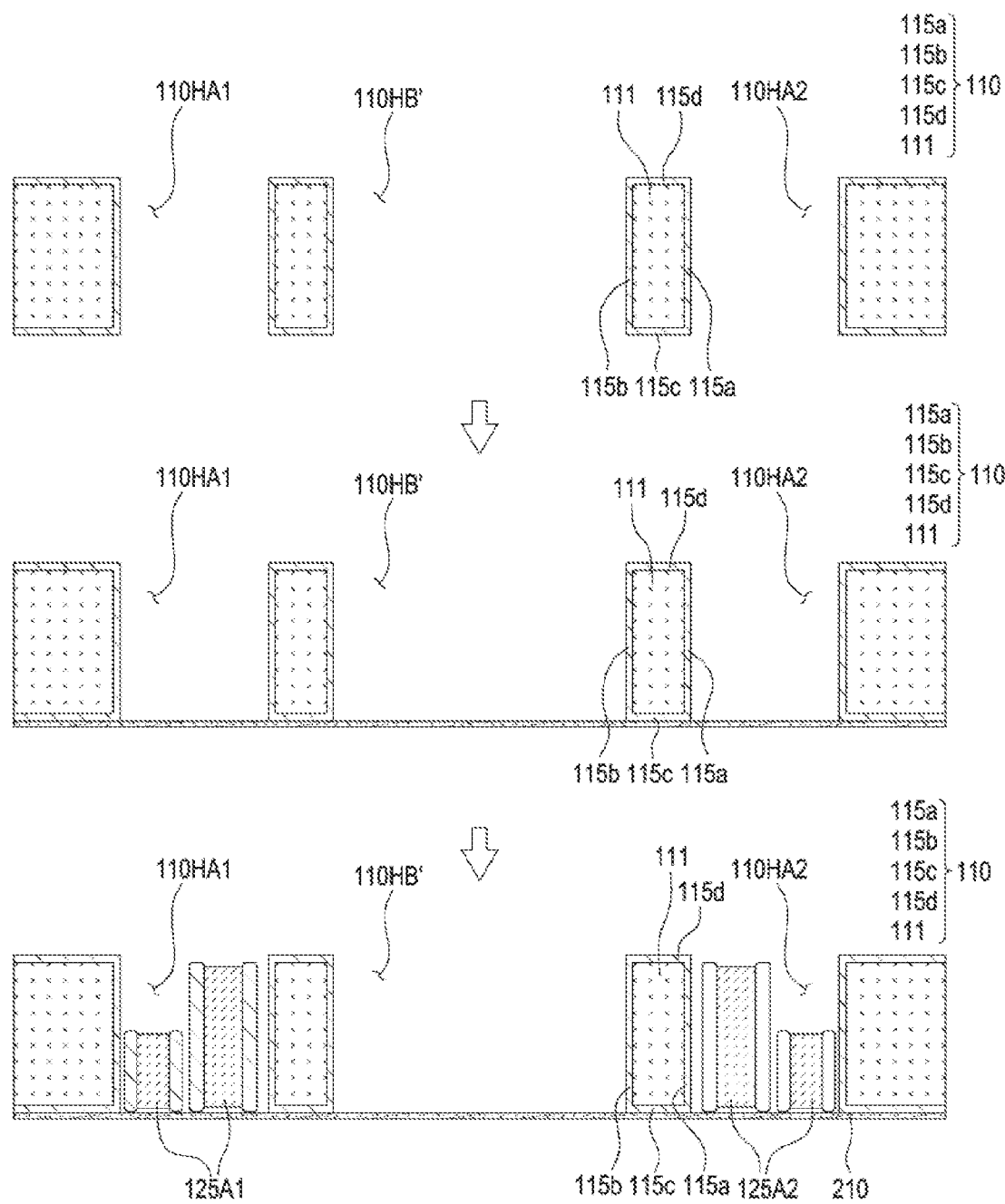
FIGS. 15A to 15E are process diagrams illustrating a schematic example of manufacturing the semiconductor package in FIG. 9.

Referring to FIG. 15A, a frame 110 is prepared first. After preparing a copper clad laminate (CCL) with the above-described panel 500, metal layers 115a, 115b, 115c, and 115d may be formed by a well-known plating process such as SAP or MSAP using a copper clad of the copper clad laminate (CCL). For example, each of the metal layers 115a, 115b, 115c, and 115d may include a seed layer and a conductive layer formed on the seed layer to have a greater thickness. First through-holes 110HA1 and 110HA2 and a preliminary second through-hole 110HB' may be formed using laser drilling and/or mechanical drilling, sandblasting or the like, depending on a material of a core insulating layer 111. Next, a first adhesive film 210 is attached to a lower side of the frame 110, and passive components 125A1 and 125A2 are disposed in the first through-holes 110HA1 and 110HA2, respectively. The first adhesive layer 210 may be a well-known tape, but is not limited thereto.

Figure 15B:
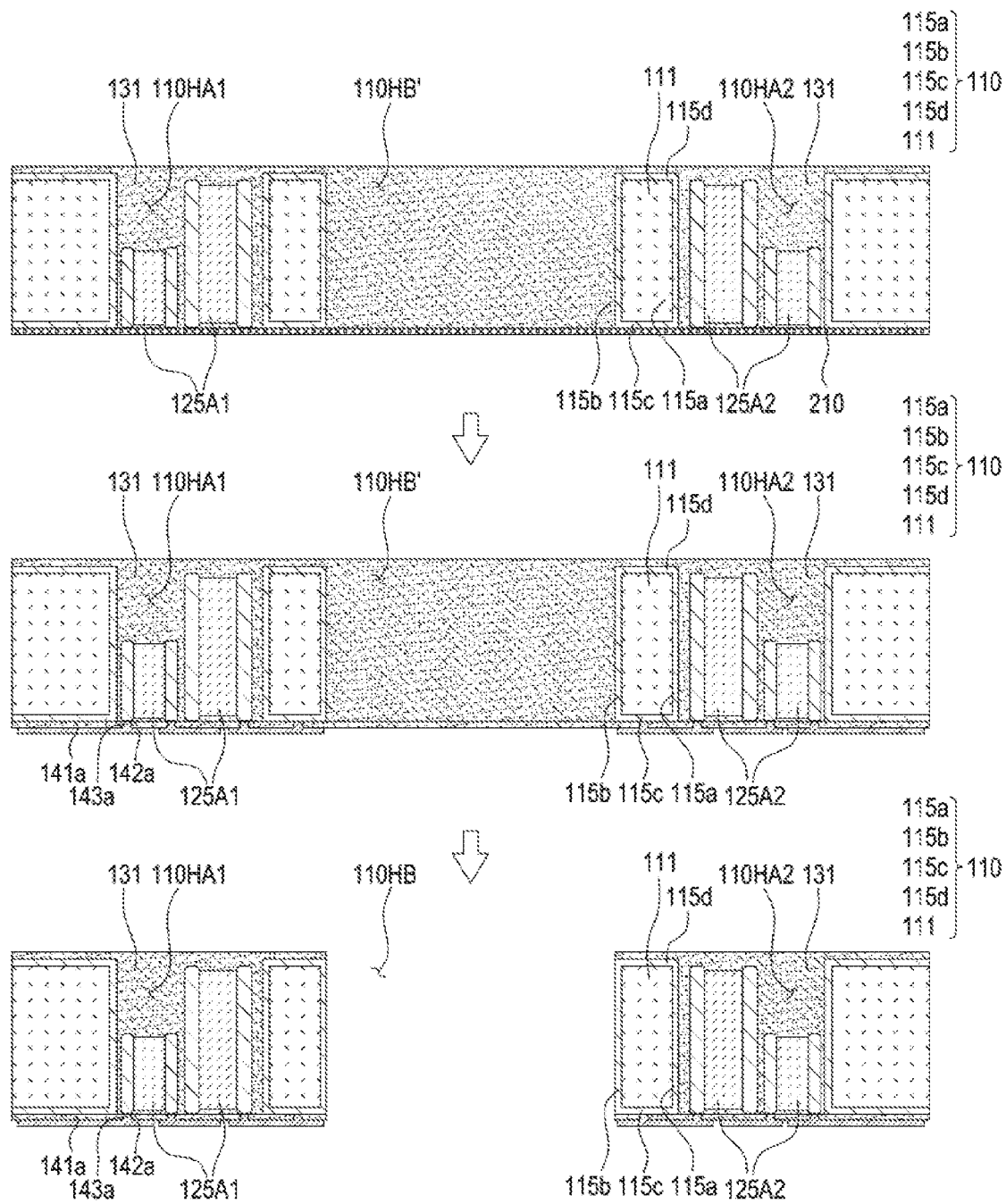

Referring to FIG. 15B, the frame 110 and the passive components 125A1 and 125A2 are encapsulated using a first encapsulant 131. The first encapsulant 131 may be formed by laminating an uncured insulating film and curing the laminated insulating film, or by coating a liquid insulating film and curing the coated insulating film. Next, the first adhesive film 210 is removed. The first adhesive film 210 may be detached using a mechanical method. After a first insulating layer 141a is formed at a portion, in which the first adhesive film 210 is removed, using an ABF lamination method and a via hole is formed as a laser via, a first redistribution layer 142a and a first connection via 143a are formed using a well-known plating process such as SAP or MSAP. For example, the first redistribution layer 142a and the first connection via 143a may include a seed layer and a conductor layer having a thickness greater than a thickness of the seed layer, respectively. A second through-hole 110HB is formed to penetrate the first encapsulant 131 and the first insulating layer 141a using laser drilling and/or a mechanical drilling, sandblasting, or the like. In this case, a side surface of the second metal layer 115b and a wall surface on which the second through-hole 110HB of the first encapsulant 131 is formed may be substantially coplanar with each other.

Figure 15C:
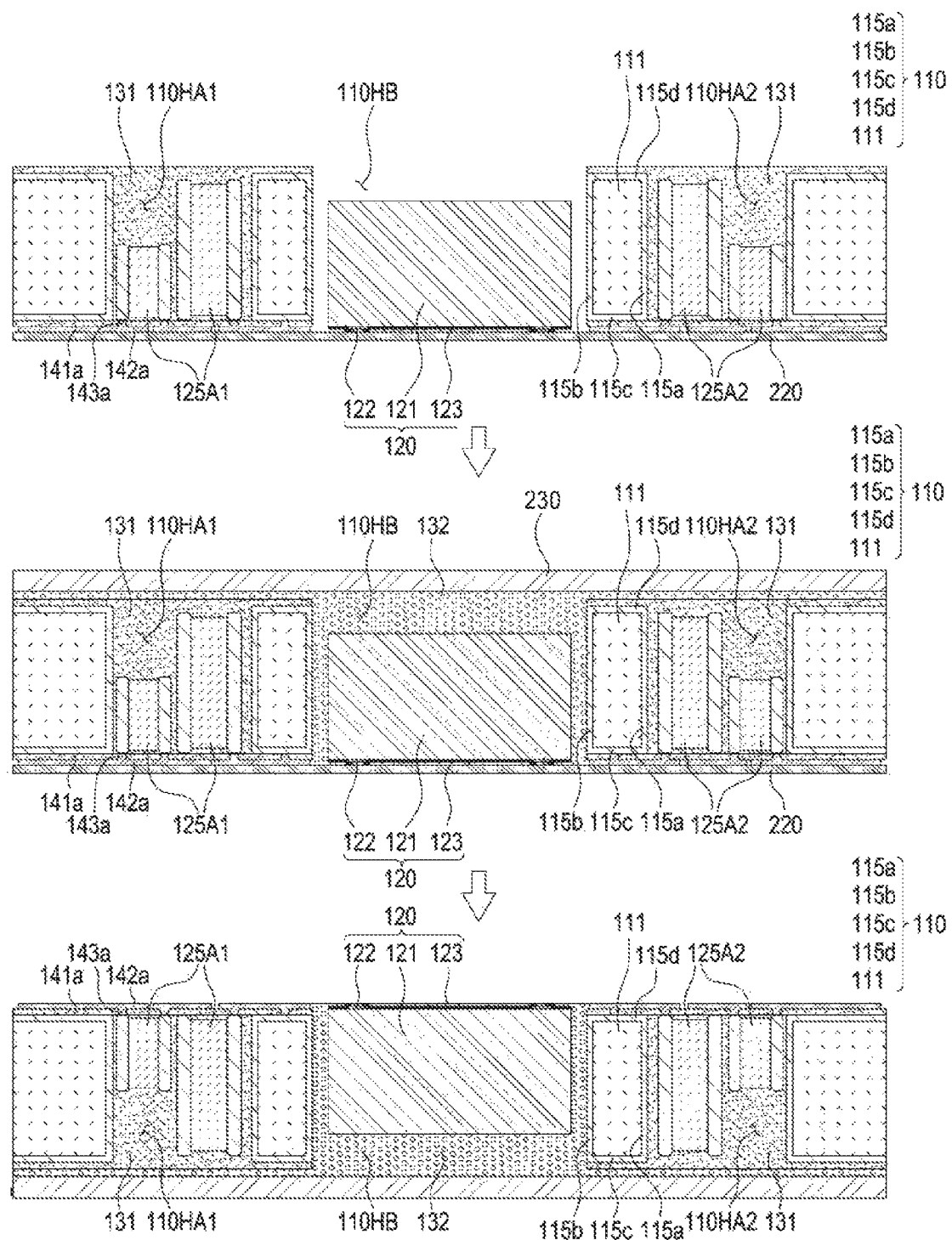

Referring to FIG. 15C, a second adhesive film 220 is attached to a lower side of the first insulating layer 141a, and a semiconductor chip 120 is attached onto a surface of the second adhesive film 220 exposed through the second through-hole 110HB in face-down form. The first encapsulant 131 and the semiconductor chip 120 are encapsulated by a second encapsulant 132. Similarly to the first encapsulant 131, the second encapsulant 132 may be formed by laminating an uncured insulating film and curing the laminated insulating film, or by coating a liquid insulating film and curing the coated insulating film. A carrier film 230 is attached to the second encapsulant 132. In a certain case, the second encapsulant 132 may be formed on the carrier film 230, and then be laminated. To perform a process, uncompleted modules fabricated vertically are turned over, and the second adhesive film 220 is separated using a mechanical method or the like to be removed.

Figure 15D:
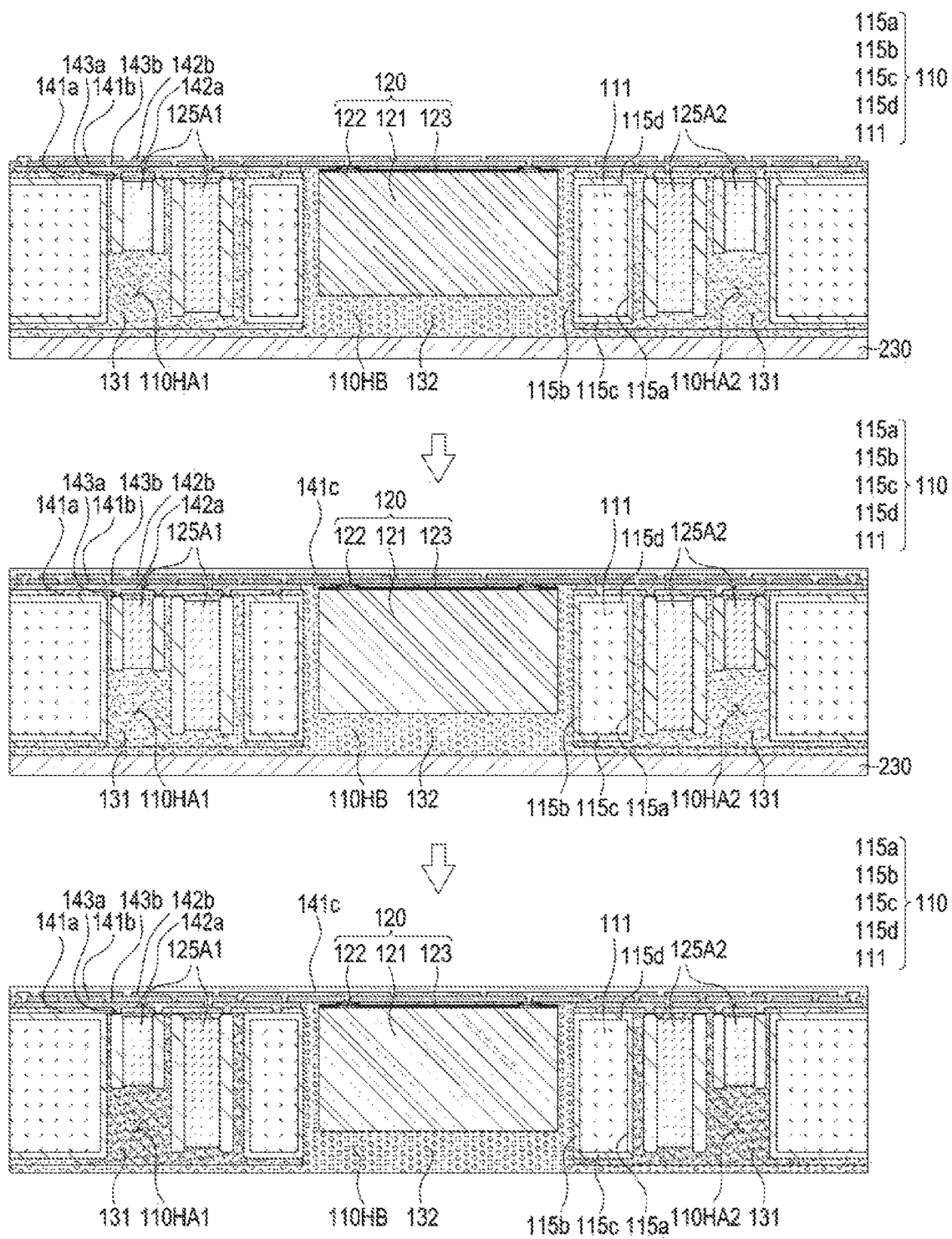

Referring to FIG. 15D, after a second insulating layer 141b is formed by laminating a photoimageable dielectric (PID) on the first insulating layer 141a and an active surface of the semiconductor chip 120 and a via hole is formed as a photo-via, a second redistribution layer 142b and a second connection via 143b are formed using the well-known plating process. The second redistribution layer 142b and the second connection via 143b may also include a seed layer and a conductor layer, respectively. A third insulating layer 141c is formed on the second insulating layer 141b using a well-known lamination or coating method. The carrier film 230 is separated to be removed.

Figure 15E:
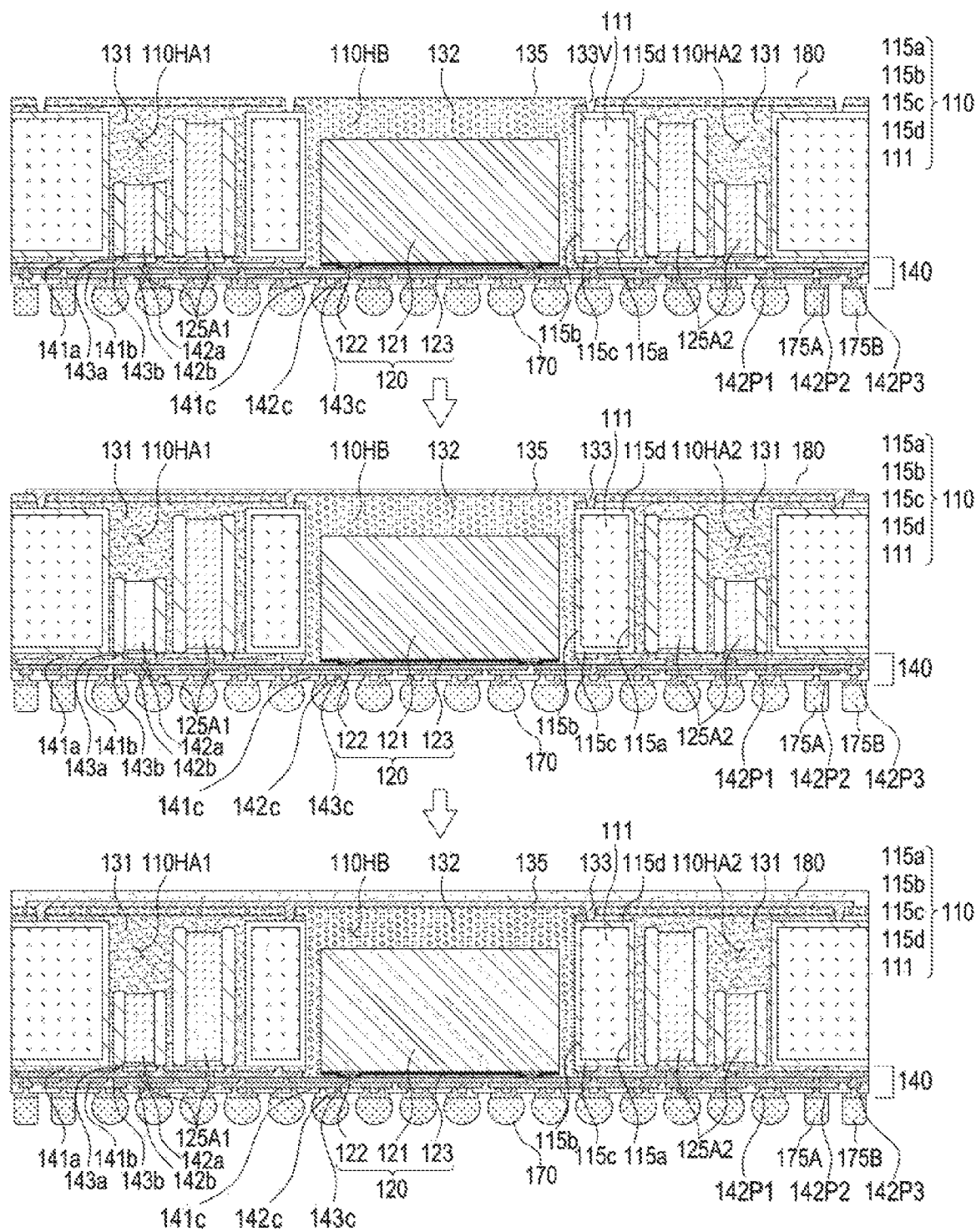

Referring to FIG. 15E, a via hole 133v is formed using laser drilling or the like to penetrate the first encapsulant 131 and the second encapsulant 132. An opening is formed on the third insulating layer 141c using laser drilling or the like to expose at least a portion of the second redistribution layer 142b. A backside metal via 133 and a backside metal layer 135 are formed using a well-known plating process. The backside metal via 133 and the backside metal layer 135 may include a seed layer and a conductor layer, respectively. A cover layer 180 is formed on the second encapsulant 132. When an electrical connection metal bump 170 and shielding members 175A and 175B are formed on a plurality of first to third pads 142P1, 142P2, and 142P3, the above-described semiconductor package 100A according to an exemplary embodiment is manufactured. Shield-dams 175a and 175b of the shielding members 175A and 175B may be formed by connecting a plurality of adjacent solder balls to each other as a result of a reflow process.

In a case in which the panel 500 in FIG. 14 or the like is used, a plurality of semiconductor packages 100A may be manufactured by a single process through the above-described series of steps. Then, individual semiconductor packages 100A may be obtained using a dicing process or the like.

Figure 16A:
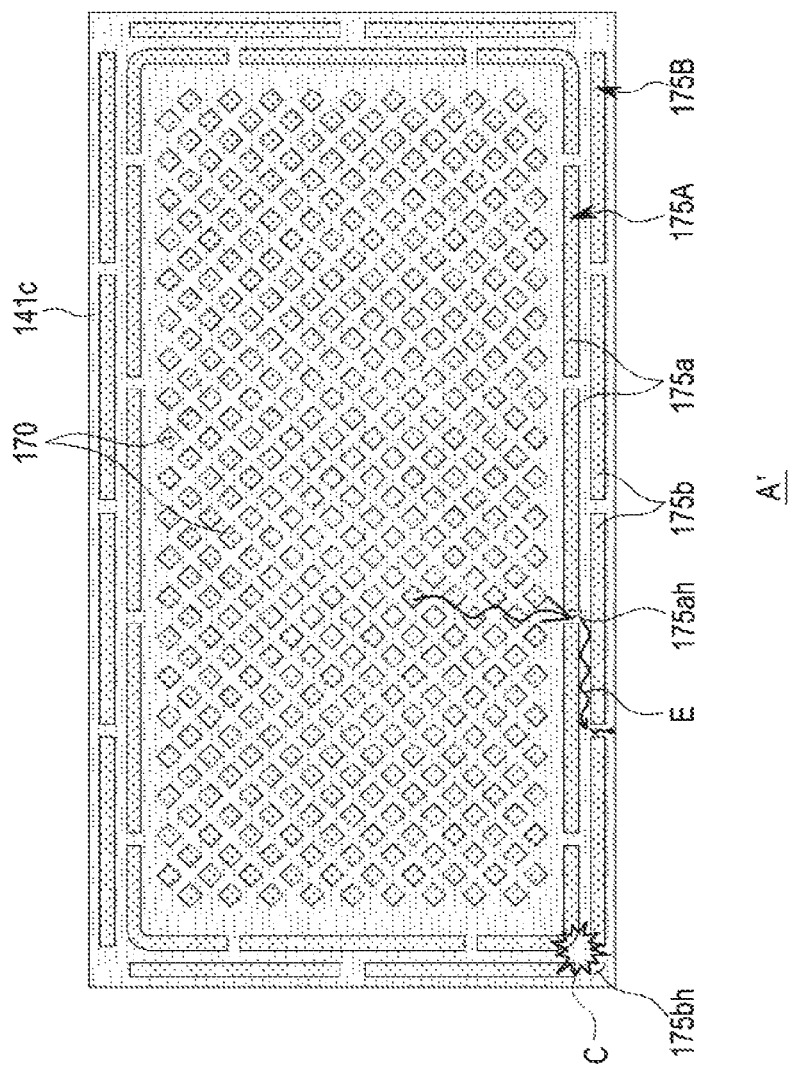
FIGS. 16A and 16B are schematic plan views illustrating various examples when the semiconductor package in FIG. 9 is viewed in direction 'A'.
Figure 16B:
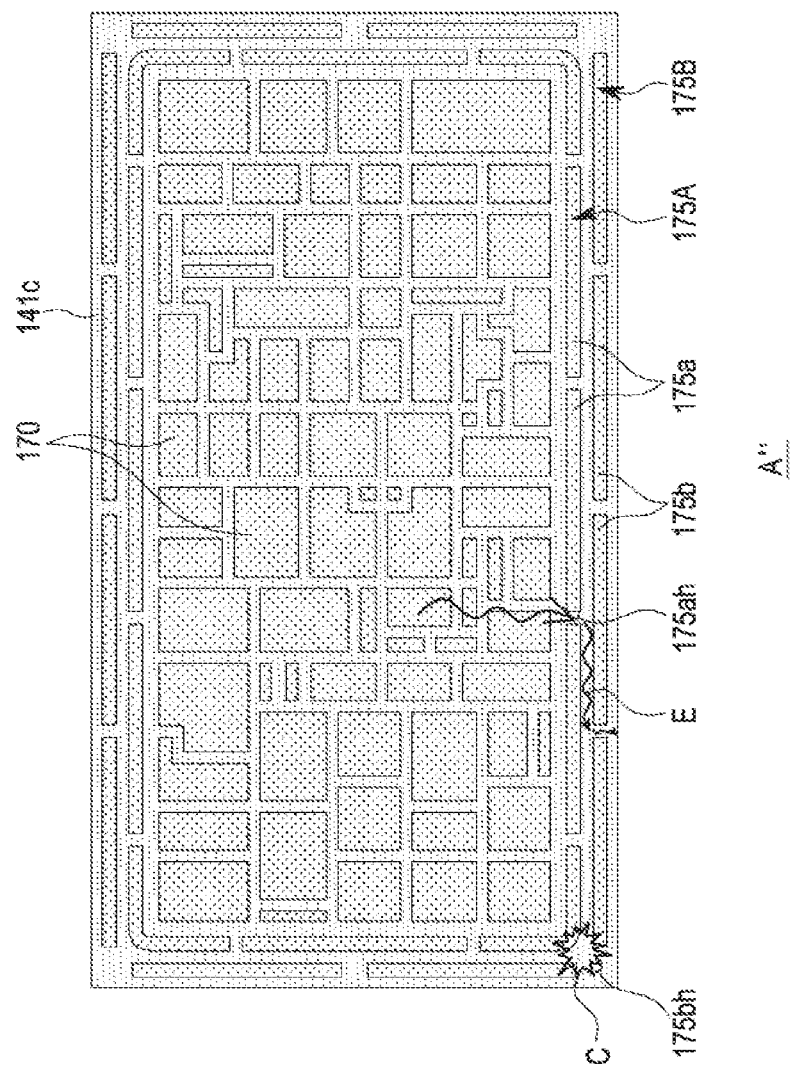

FIGS. 16A and 16B are schematic plan views illustrating various examples when the semiconductor package in FIG. 9 is viewed in direction 'A'.

Referring to FIGS. 16A and 16B, in plan views A' and A" according to another exemplary embodiment, an electrical connection metal bump 170 may be land grid array (LGA)

type. For example, the above-described semiconductor package 100A according to an exemplary embodiment may be ball grid array (BGA) type as well as LGA type. In a case in which the semiconductor package 100A is LGA type, shielding members 175A and 175B having shield-dams 175a and 175b and gaps 175ah and 175bh may be introduced to effectively shield electromagnetic waves E and a design may also be promoted to prevent cracking C of a reliability-vulnerable point.

Figure 17:
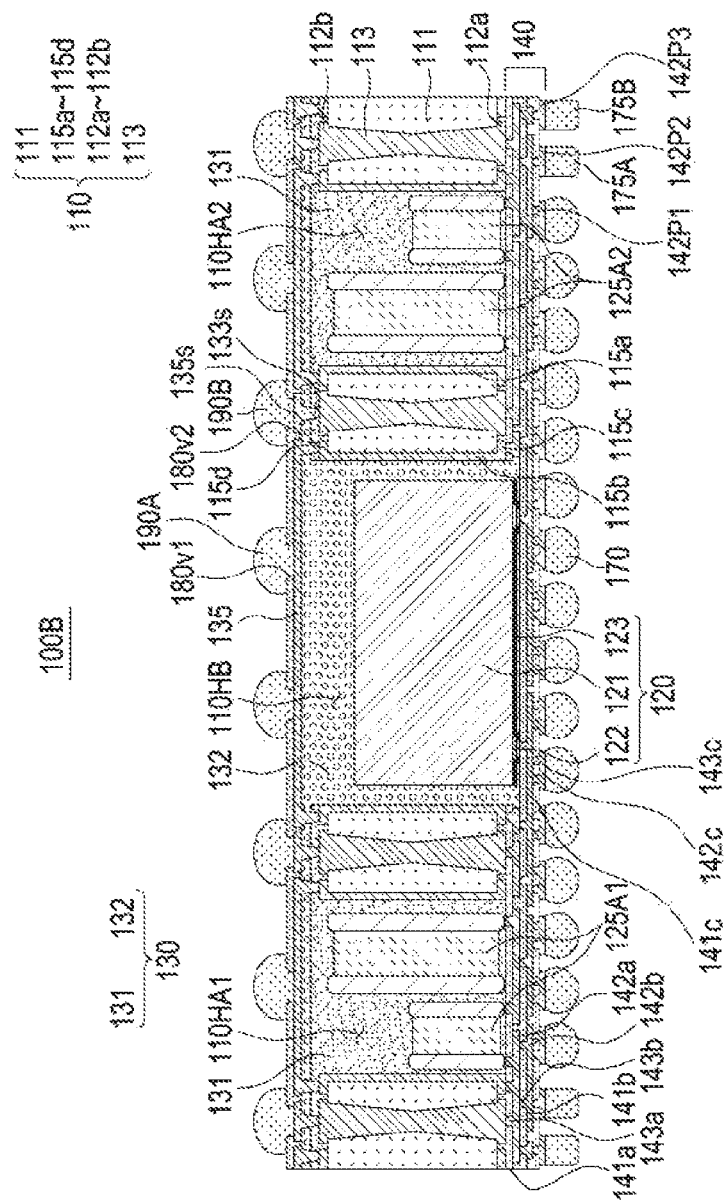
FIG. 17 schematically illustrates another example of a semiconductor package.

FIG. 17 schematically illustrates another example of a semiconductor package.

Referring to FIG. 17, a semiconductor package 100B according to another exemplary embodiment includes a frame 110 including first and second wiring layers 112a and 112b disposed on a bottom surface and a top surface of a core insulating layer 111, respectively, and a wiring via 113 penetrating the first and second wiring layers 112a and 112b and the core insulating layer 111 to electrically connect the first and second wiring layers 112a and 112b to each other. The first and second wiring layers 112a and 112b may be electrically connected to a connection pad 122 of a semiconductor chip 120 and/or passive components 125A1 and 125A2 through redistribution layers 142a, 142b, and 142c and connection vias 143a and 143b. Due to the frame 110, the semiconductor package 100B has a vertical electrical connection path to be introduced to a package-on-package structure.

The wiring layers 112a and 112b serve to redistribute the connection pad 122 of the semiconductor chip 120. A material for forming the wiring layers 112a and 112b may be a conductive material such as copper (Cu), aluminum (Al), silver (Ag), tin (Sn), gold (Au), nickel (Ni), lead (Pb), titanium (Ti), alloys thereof, or the like. The wiring layers 112a and 112b may perform various functions depending on designs of their corresponding layers. For example, the wiring layers 112a and 112b may include ground (GND) patterns, signal (S) patterns, and the like. The signal patterns may include various signals such as a data signal and the like except for ground (GND) patterns, power (PWR) patterns, and the like. In addition, the wiring layers 112a and 112b may include via pads, wire pads, electrical connection metal bump pads, and the like. The wiring layers 112a and 112b may also be formed using a well-known plating process, and may include a seed layer and a conductor layer, respectively. Each of the wiring layers 112a and 112b may have a thickness greater than a thickness of each of the redistribution layers 142a, 142b, and 142c.

A material of the core insulating layer 111 is not limited, and may be, for example, an insulating material. The insulating material may be a thermosetting resin such as an epoxy resin, a thermoplastic resin such as polyimide, or a resin, in which these resins are mixed or impregnated with a core material such as a glass fiber (or a glass cloth or a glass fabric) or the like together with an inorganic filler such as silica, for example, prepreg or the like.

A wiring via 113 electrically connects the wiring layers 112a and 112b formed on different layers, resulting in formation of an electrical path in the frame 110. A material for forming the wiring via 113 may also be a conductive material. The wiring via 113 may be completely filled with a conductive material, or may be a via in which a conductive material is formed along a wall surface of a via hole. In addition, the wiring via 113 may have a sandglass shape. The wiring via 113 may also be formed suing a well-known plating process and may include a seed layer and a conductor layer.

In addition to the backside metal layer 135, a backside wiring layer 135s may be further disposed on the second encapsulant 132 of the semiconductor package 100B according to another exemplary embodiment. The backside wiring layer 135s may be connected to the second wiring layer 112b of the frame 110 through the backside wiring via 133s penetrating the first and second encapsulants 131 and 132. Openings 180v1 and 180vs may be formed in the cover layer 180 to expose at least a portion of the backside metal layer 135 and at least a portion of the backside wiring layer 135s, respectively. Electrical connection metal bumps 190A and 190B may be disposed on the openings 180v1 and 180v2 to be connected to the backside metal layer 135 and the backside wiring layer 135s exposed therethrough, respectively.

The backside metal layer 135 and the backside metal via 133 are formed for the purpose of EMI shielding and heat radiation. When the backside metal layer 135 and the backside metal via 133 are connected to a printed circuit board such as a mainboard through the electrical connection metal bump 190A, EMI shielding and heat radiation effects may be further improved. The backside metal layer 135 and the backside metal via 133 may be used as grounds, as mentioned above, and may be electrically connected to grounds of wiring layers 142a, 142b, and 142c of the connection member 140 through metal layers 115a, 115b, 115c, and 115d of the frame 110.

A backside wiring layer 135s and a backside wiring via 133s may be electrically connected to the semiconductor chip 120 and/or passive components 125A1 and 125A2 through the wiring layers 112a and 112b and the wiring via 113 of the frame 110 and wiring layers 142a, 142b, and 142c and the connection vias 143a and 143b. For example, the backside wiring layer 135s and the backside wiring via 135s are mainly aimed at signal connection. The backside wiring layer 135s may be electrically connected to the printed circuit board such as a mainboard through the electrical connection metal bump 190B to provide an electrical path between the semiconductor package 100B and the printed circuit board. In this case, the semiconductor package 100B may has a backside portion mounted on the printed circuit board and a front portion connected to an antenna substrate or the like through the electrical connection metal bump 170 in the form of package-on-package. For example, the semiconductor package 100B according to an exemplary embodiment may be easily applied to various types of module structure in the form of package-on-package. The backside wiring layer 135s and the backside wiring via 133s may include a conductive material such as copper (Cu), aluminum (Al), silver (Ag), tin (Sn), gold (Au), nickel (Ni), lead (Pb), titanium (Ti) or alloys thereof.

The backside metal layer 135 may cover most of a top surface of the second encapsulant 132, as described above, but may not cover a space in which the backside wiring layer 135s is formed. In this case, the backside metal layer 135 and the backside wiring layer 135s may be physically spaced apart from each other by a predetermined distance. For example, the backside wiring layer 135s may be disposed in the form of an island based on the backside metal layer 135.

Each of the electrical connection metal bumps 190A and 190B may include a low-melting point metal, for example, tin (Sn) or a tin (Sn)-containing alloy. More specifically, each of the electrical connection metal bumps 190A and 190B may be formed of a solder or the like. However, this case is merely an example and a material thereof is not limited thereto. Each of the electrical connection metal bumps 190A and 190B may be a land, a ball, a pin, or the like. Each of the electrical connection metal bumps 190A and 190B may be formed as a multi-layer structure and a single-layer structure. In a case in which each of the electrical connection metal bumps 190A and 190B is formed as a single-layer structure, each of the electrical connection metal bumps 190A and 190B may include a tin-silver solder or copper. However, this case is also merely an example and a material thereof is not limited thereto.

The other explanations will be omitted because they are substantially the same as described above with reference to FIGS. 9 to 16B.

Figure 18:
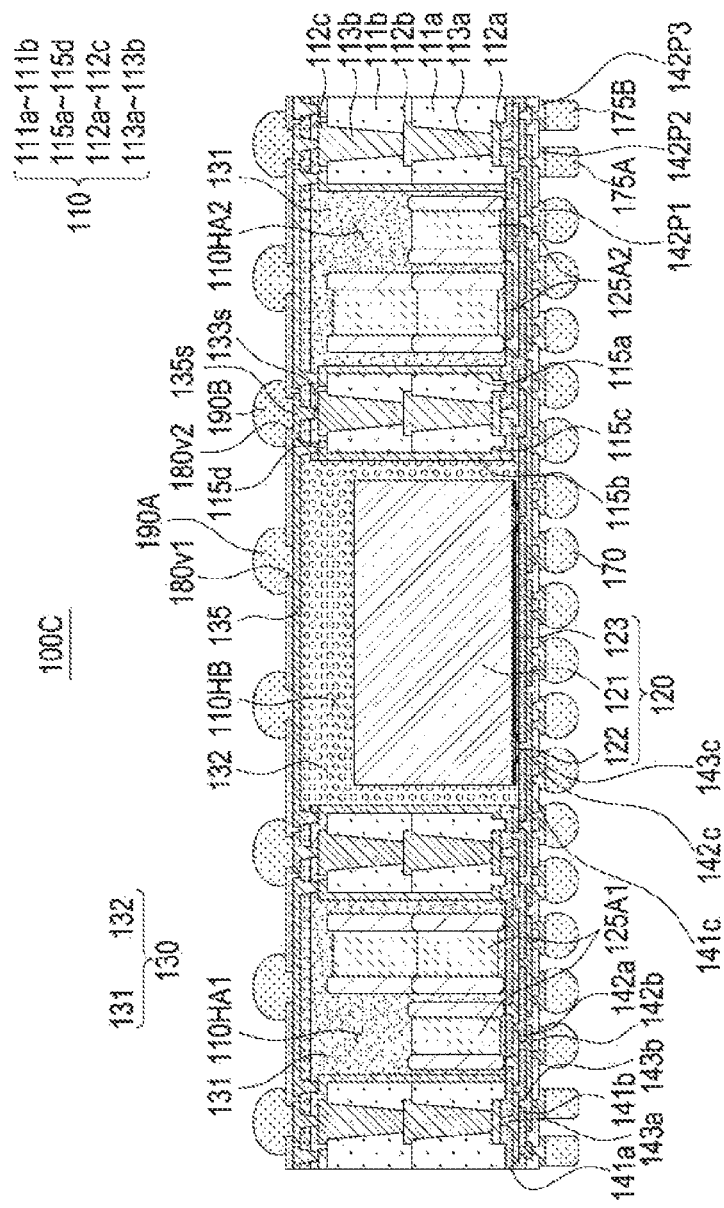
FIG. 18 schematically illustrates another example of a semiconductor package.

FIG. 18 schematically illustrates another example of a semiconductor package.

Referring to FIG. 18, a semiconductor package 100C according to another exemplary embodiment includes, in the above-described semiconductor package 100B, a frame 110 including a first core insulating layer 111a brought in contact with a connection member 140, a first wiring layer 112a brought in contact with the connection member 140 and embedded in the first core insulating layer 111a, a second wiring layer 112b disposed to oppose to the embedded first wiring layer 112a of the core insulating layer 111a, a second core insulating layer 111b disposed on the first core insulating layer 111a to cover at least a portion of the second wiring layer 112b, and a third wiring layer 112c disposed on the second core insulating layer 111b. The first to third wiring layers 112a, 112b, and 112c are electrically connected to a connection pad 122. The first and second wiring layers 112a and 112b and the second and third wiring layers 112b and 112c are electrically connected to each other through first and second wiring vias 113a and 113b penetrating the first and second core insulating layers 111a and 111b, respectively.

The first wiring layers 112a may be recessed inwardly of the first core insulating layer 111a. In a case in which the first wiring layer 112a is recessed inwardly of the first core insulating layer 111a to form a step between a bottom surface of the first core insulating layer 111a and a bottom surface of the first redistribution layer 112a, a material for forming a first encapsulant 131 may be prevented from bleeding and contaminating the first wiring layer 112a. Each of the wiring layers 112a, 112b, and 112c of the frame 110 may have a thickness greater than a thickness of each of redistribution layers 142a, 142b, and 142c of the connection member 140.

A material of the core insulating layers 111a and 111b is not limited. For example, the material of the core insulating layers 111a and 111b may be an insulating material. The insulating material may be a thermosetting resin such as an epoxy resin, a thermoplastic resin such as polyimide, or a resin, in which these resins are impregnated with a core material such as a glass fiber (or a glass cloth or a glass fabric) or the like together with an inorganic filler such as silica, for example, prepreg Ajinomoto build-up film (ABF). If necessary, the material of the core insulating layers 111a and 111b may be a photoimageable dielectric (PID) resin.

When a hole for the first wiring via 113a is formed, some pads of the first wiring layer 112a may serve as a stopper. Accordingly, it may be advantageous for a process that the first wiring via 113a has a tapered shape in which a top surface has a width greater than a width of a bottom surface. In this case, the first wiring via 113a may be integrated into a pad pattern of the second wiring layer 112b.

The other explanations will be omitted because they are substantially the same as described above with reference to FIGS. 9 to 17.

Figure 19:
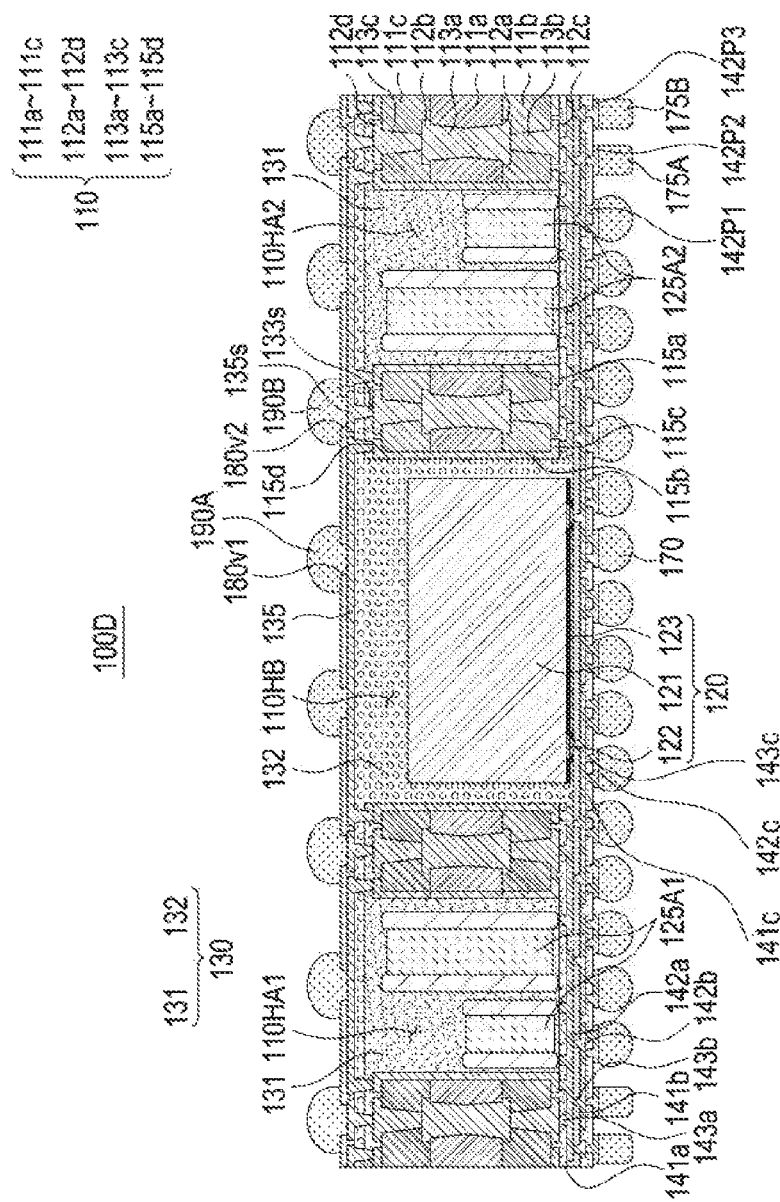
FIG. 19 schematically illustrates another example of a semiconductor package.

FIG. 19 schematically illustrates another example of a semiconductor package.

Referring to FIG. 19, a semiconductor package 100D according to another exemplary embodiment includes, in the above-described semiconductor package 100B, a frame 110 including a first core insulating layer 111a, a first wiring layer 112a and a second wiring layer 112b disposed on a bottom surface and a top surface of the first core insulating layer 111a, respectively, a second core insulating layer 111b disposed on a bottom surface of the first core insulating layer 112a to cover at least a portion of the first wiring layer 112a, a wiring layer 111c disposed on a bottom surface of the second core insulating layer 111b, a third core insulating layer 111c disposed on a top surface of the first core insulating layer 111a to cover at least a portion of the second wiring layer 112b, and a fourth wiring layer 112d disposed on a top surface of the third core insulating layer 111c. The first to fourth wiring layers 112a, 112b, 112c, and 112d are electrically connected to a connection pad 122. Since the frame 110 include a larger number of the wiring layers 112a, 112b, 112c, and 112d, a connection member 140 may be further simplified. Thus, yield reduction occurring during formation of the connection member 140 may be prevented. The first to fourth wiring layers 112a, 112b, 112c, and 112d may be electrically connected to each other through first to third wiring vias 113a, 113b, and 113c respectively penetrating the first to third core insulating layers 111a, 111b, and 111c.

The first core insulating layer 111a may have a thickness greater than a thickness of the second core insulating layer 111b and a thickness of the third core insulating layer 111c. The first core insulating layer 111a may basically have a relatively great thickness to maintain rigidity, and the second and third core insulating layers 111b and 111c may be introduced to form a larger number of wiring layers 112c and 112d. The first core insulating layer 111a may include a material different from a material of the second core insulating layer 111b and a material of the third core insulating layer 111c. The first core insulating layer 111a may be, for example, a prepreg including a core material, a filler, and an insulating resin, and each of the second and third core insulating layers 111b and 111c may be an ABF or a PID including a filler and an insulating resin but a material thereof is not limited thereto. From a similar viewpoint, a first wiring via 113a penetrating the first core insulating layer 111a may have a diameter greater than a diameter of a second wiring via 113b penetrating the second core insulating layer 111b and a diameter of a third wiring via 111c penetrating the third core insulating layer 111c. Similarly, thicknesses of the wiring layers 112a, 112b, 112c, and 112d of the frame 110 may be greater than thicknesses of redistribution layers 142a, 142b, and 142c of the connection member 140.

The other explanations will be omitted because they are substantially the same as described above with reference to FIGS. 9 to 18.

Figure 20:
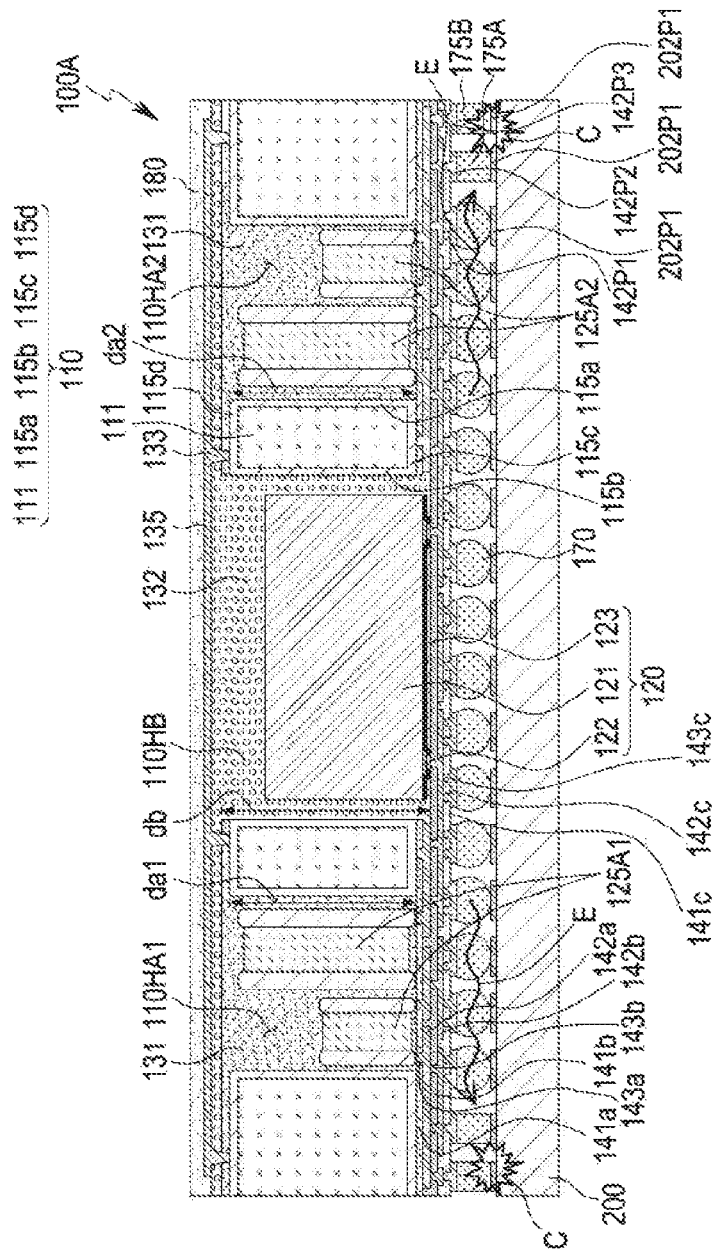
FIG. 20 is a schematic cross-sectional view illustrating an electromagnetic shielding effect in a case in which the semiconductor package in FIG. 9 is mounted on a printed circuit board.

FIG. 20 is a schematic cross-sectional view illustrating an electromagnetic shielding effect in a case in which the semiconductor package in FIG. 9 is mounted on a printed circuit board.

Referring to FIG. 20, a semiconductor package 100A according to an exemplary embodiment may be mounted on a printed circuit board 200, and the printed circuit board 200 may be a mainboard of an electronic device. The printed circuit board 200 may include a plurality of mounting pads 202P1, 202P2, and 202P3 to which the semiconductor package 100A is applied. For example, the printed circuit board 200 may include a first mounting pad 202P1 connected to an electrical connection metal bump 170, a second mounting pad 202P2 connected to a first shielding member 175A, and a third mounting pad 202P3 connected to a second shielding member 175B. The shielding members 175A and 175B are designed at an outer edge of a lower side of the semiconductor package 100A to effectively prevent electromagnetic waves E from radiating through a space between the semiconductor package 100A and the printed circuit board 200 and to prevent cracking of a reliability-vulnerable point. This may be applied to semiconductor packages 100B, 100C, and 100D according to other exemplary embodiments.

FIG. 21 is a schematic plan view illustrating a significant decrease in a mounting area in a case in which the semiconductor package in FIG. 9 is applied to an electronic device.

Referring to FIG. 21, with the recent trend toward large-sized displays for mobile devices 1100A and 1100B, there is a rising need to increase battery capacity. Since an area occupied by the battery 1180 increases as battery capacity increases, a printed circuit board 1101 should decrease in size. Accordingly, a component mounting area is reduced to result in continuous decrease in the area that may be occupied by a module 1150 including passive components. In a case in which the semiconductor package 100A according to an exemplary embodiment is applied to the module 1150, a size of the semiconductor package 100A may significantly decrease. This may be applied to semiconductor packages 100B, 100C, and 100D according to other exemplary embodiments.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

As described above, according to exemplary embodiment in the present disclosure, a structure may be provided to effectively shield electromagnetic waves radiating through a space between a board and a package.

While exemplary embodiments have been shown and described above, it will be apparent to those skilled in the art that modifications and variations could be made without departing from the scope of the present invention as defined by the appended claims.

What is claimed is:
1. A semiconductor package comprising:
a semiconductor chip having an active surface on which connection pads are disposed and an inactive surface opposing the active surface;
an encapsulant covering at least a portion of the semiconductor chip; and
a connection member disposed on the encapsulant and the active surface of the semiconductor chip, the connection member including a redistribution layer,
wherein the redistribution layer includes a plurality of first pads, a plurality of second pads disposed along a circumference of the connection member to surround the plurality of first pads, and a plurality of third pads disposed along the circumference of the connection member to surround the plurality of second pads, and
in an extending direction of the circumference of the connection member, gaps between the plurality of second pads and gaps between the plurality of third pads are staggered with each other.

2. The semiconductor package of claim 1, wherein each of the plurality of second pads and each of the plurality of third pads have shapes different from a shape of each of the plurality of first pads.

3. The semiconductor package of claim 1, wherein each of the plurality of second pads and each of the plurality of third pads have predetermined lengths along the circumference of the connection member, and
the predetermined lengths are greater than widths of the gaps of the plurality of second pads and the gaps of the plurality of third pads.

4. The semiconductor package of claim 3, wherein each of the plurality of first pads has a circular shape.

5. The semiconductor package of claim 1, wherein the plurality of third pads have at least one gap disposed in at least one corner of the connection member, and
at least one of the plurality of second pads is disposed the corner of the connection member at which the at least one gap of the plurality of third pads is disposed.

6. The semiconductor package of claim 1, wherein at least one of the plurality of first pads is electrically connected to a connection pad for a signal among the connection pads, and
each of the plurality of second pads and each of the plurality of third pads are electrically connected to a connection pad for a ground among the connection pads.

7. The semiconductor package of claim 1, wherein at least one of the plurality of first pads is electrically connected to a connection pad for a signal among the connection pads, and
each of one of the plurality of second pads and the plurality of third pads is electrically connected to ground connection pads among the connection pads.

8. The semiconductor package of claim 1, further comprising:
a plurality of electrical connection metal bumps disposed on the connection member and electrically connected to the plurality of first pads, respectively;
a plurality of first shield-dams disposed on the connection member and electrically connected to the plurality of second pads, respectively; and
a plurality of second shield-dams disposed on the connection member and electrically connected to the plurality of third pads, respectively,
wherein in the extending direction of the circumference of the connection member, gaps between the plurality of first shield-dams and gaps between the plurality of second shield-dams are staggered with each other.

9. The semiconductor package of claim 8, wherein each of the plurality of first shield-dams and each of the plurality second shield-dams have dam shapes having predetermined lengths along the circumference of the connection member, and the predetermined lengths are greater than widths of the gaps of the plurality of first shield-dams and the gaps of the plurality of second shield-dams, respectively.

10. The semiconductor package of claim 9, wherein each of the plurality of electrical connection metal bumps has a ball shape.

11. The semiconductor package of claim 8, wherein the plurality of second shield-dams have at least one gap disposed in at least one corner of the connection member, and at least one of the plurality of first shield-dams is disposed at the corner of the connection member at which the at least one gap of the plurality of second shield-dams is disposed.

12. The semiconductor package of claim 8, wherein at least one of the plurality of electrical connection metal bumps is electrically connected to a connection pad for a signal among the connection pads, and each of the plurality of first shield-dams and each of the plurality of second shield-dams are electrically connected to a connection pad for a ground among the connection pads.

13. The semiconductor package of claim 12, wherein at least one of the plurality of electrical connection metal bumps is electrically connected to a connection pad for a signal among the connection pads, and each of one of the plurality of first shield-dams and one of the plurality of second shield-dams is electrically connected to ground connection pads among the connection pads.

14. The semiconductor package of claim 8, wherein each of the plurality of electrical connection metal bumps and each of the plurality of first shield-dams and the plurality of second shield-dams include a low-melting point metal including tin (Sn) or a tin (Sn)-containing alloy.

15. The semiconductor package of claim 8, wherein each of the plurality of electrical connection metal bumps, each of the plurality of first shield-dams, and each of the plurality of second shield-dams are disposed side by side at the same level.

16. The semiconductor package of claim 8, wherein in a direction perpendicular to the circumference of the connection member, the gaps between the plurality of second shield-dams respectively overlay within one or more of the plurality of first shield-dams and the gaps between the plurality of first shield-dams overlay within one or more of the plurality of second shield-dams.

17. The semiconductor package of claim 1, wherein in a direction perpendicular to the circumference of the connection member, the gaps between the plurality of second pads overlay within one or more of the plurality of third pads and the gaps between the plurality of third pads overlay within one or more of the plurality of second pads.

18. The semiconductor package of claim 1, wherein the connection member includes a plurality of redistribution layer disposed on different levels with respect to the active surface of the semiconductor chip, and the redistribution layer, which includes the plurality of first pads, the plurality of second pads, and the plurality of third pads, is one farthest away from the active surface among the plurality of redistribution layer.

19. The semiconductor package of claim 1, further comprising:

a frame having a first through-hole in which the semiconductor chip is disposed; and a backside metal layer disposed on the inactive surface of the semiconductor chip and electrically connected to metal layers disposed on surfaces of the frame through a backside metal via penetrating the encapsulant.

20. The semiconductor package of claim 19, wherein the backside metal layer is electrically connected to the plurality of second pads and the plurality of third pads.

21. The semiconductor package of claim 19, wherein the frame further includes a second through-hole in which a passive component is disposed, and the encapsulant includes a first encapsulant encapsulating the passive component and filling at least a portion of the second through-hole, and a second encapsulant encapsulating the semiconductor chip, filling at least a portion of the first through-hole, and encapsulating the first encapsulant.

22. A semiconductor package comprising:

a semiconductor chip having an active surface on which connection pads are disposed and an inactive surface opposing the active surface;

an encapsulant covering at least a portion of the semiconductor chip; and a connection member disposed on the encapsulant and the active surface of the semiconductor chip, the connection member including a redistribution layer, wherein the redistribution layer includes a plurality of first pads, a plurality of second pads spaced apart from each other by first gaps and surrounding the plurality of first pads, and a plurality of third pads spaced apart from each by second gaps other and surrounding the plurality of second pads, and one of the plurality of second pads is disposed between the plurality of first pads and one of the second gaps.

23. The semiconductor package of claim 22, wherein one of the first gaps is disposed between the plurality of first pads and one of the third pads.

24. The semiconductor package of claim 22, wherein another of the second gaps is disposed in at least one corner of the connection member, and at least one of the plurality of second pads is disposed the corner of the connection member at which the another of the second gaps is disposed.

25. The semiconductor package of claim 22, wherein each of the plurality of second pads and each of the plurality of third pads have shapes different from a shape of each of the plurality of first pads.

26. The semiconductor package of claim 22, wherein each of the plurality of second pads and each of the plurality of third pads have predetermined lengths along the circumference of the connection member, and the predetermined lengths are greater than widths of the first gaps of the plurality of second pads and the second gaps of the plurality of third pads.

27. The semiconductor package of claim 22, further comprising:

a plurality of electrical connection metal bumps disposed on the connection member and electrically connected to the plurality of first pads, respectively;

a plurality of first shield-dams disposed on the connection member, spaced apart from each other by third gaps, and electrically connected to the plurality of second pads, respectively; and a plurality of second shield-dams disposed on the connection member, spaced apart from each other by fourth gaps, and electrically connected to the plurality of third pads, respectively, wherein one of the plurality of first shield-dams is disposed between the plurality of electrical connection metal bumps and one of the fourth gaps.

28. The semiconductor package of claim 27, wherein one of the third gaps is disposed between the plurality of electrical connection metal bumps and one of the plurality of second shield-dams.

\* \* \* \* \*